US010885985B2

(12) United States Patent
Cargnini et al.

(10) Patent No.: US 10,885,985 B2
(45) Date of Patent: Jan. 5, 2021

(54) PROCESSOR IN NON-VOLATILE STORAGE MEMORY

(71) Applicant: Western Digital Technologies, Inc., Irvine, CA (US)

(72) Inventors: Luis Vitorio Cargnini, San Jose, CA (US); Viacheslav Anatolyevich Dubeyko, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 267 days.

(21) Appl. No.: 15/395,474

(22) Filed: Dec. 30, 2016

(65) Prior Publication Data
US 2018/0188973 A1 Jul. 5, 2018

(51) Int. Cl.
*G11C 16/24* (2006.01)
*G11C 16/10* (2006.01)

(52) U.S. Cl.
CPC ............ *G11C 16/24* (2013.01); *G11C 16/10* (2013.01)

(58) Field of Classification Search
CPC ............ G06F 15/7807; G06F 15/7821; G06F 9/44505; G06F 15/785; G06F 9/3851; G06F 3/0679; G06F 3/0652; G06F 3/0659; G06F 3/0644; G06F 3/0611; G06F 3/06; G11C 16/34; G11C 16/10; G11C 16/24; G11C 16/26
See application file for complete search history.

(56) References Cited
U.S. PATENT DOCUMENTS

| 4,884,193 | A | 11/1989 | Lang |
| 5,323,335 | A | 6/1994 | Mitchell |
| 6,006,322 | A | 12/1999 | Muramatsu |
| 6,542,955 | B1 | 4/2003 | Chen |
| 7,496,908 | B2* | 2/2009 | DeWitt, Jr. ............ G06F 8/443 717/154 |
| 7,571,300 | B2 | 8/2009 | Wong |

(Continued)

OTHER PUBLICATIONS

Heui Lee, P. Beckett and B. Appelbe, "High-performance extendable instruction set computing," Proceedings 6th Australasian Computer Systems Architecture Conference. ACSAC 2001, Gold Coast, Queensland, Australia, 2001, pp. 89-94.*

(Continued)

*Primary Examiner* — Pierre Miche Bataille
(74) *Attorney, Agent, or Firm* — Arent Fox LLP

(57) ABSTRACT

In one example, a computing system includes a device, the device including: a non-volatile memory divided into a plurality of selectable locations, each bit in the non-volatile memory configured to have corresponding data independently altered, wherein the selectable locations are grouped into a plurality of data lines; and one or more processing units coupled to the non-volatile memory, each of the processing units associated with a data line of the plurality of data lines, and each of the processing units configured to compute, based on data in an associated data line of the plurality of data lines, corresponding results, wherein the non-volatile memory is configured to selectively write, based on the corresponding results, data in selectable locations of the associated data line reserved to store results of the computation from the process unit associated with the associated data line.

16 Claims, 19 Drawing Sheets

(56) References Cited

U.S. PATENT DOCUMENTS

| | | | |
|---|---|---|---|
| 8,078,835 B2 | 12/2011 | Yang et al. | |
| 8,201,159 B2 | 6/2012 | Gschwind | |
| 8,555,005 B2 | 10/2013 | Egger et al. | |
| 9,239,691 B2* | 1/2016 | Lam .................. | G06F 12/0875 |
| 2002/0004897 A1* | 1/2002 | Kao .................. | G06F 9/30149 712/227 |
| 2004/0003201 A1 | 1/2004 | Burns et al. | |
| 2005/0155020 A1* | 7/2005 | DeWitt, Jr. ......... | G06F 12/126 717/130 |
| 2005/0246698 A1* | 11/2005 | Chung ................ | G06F 9/3001 717/151 |
| 2007/0113048 A1* | 5/2007 | Royer ................ | G06F 15/7864 712/34 |
| 2008/0168256 A1* | 7/2008 | Wong ................ | G06F 9/30014 712/29 |
| 2015/0324199 A1 | 11/2015 | Deng et al. | |
| 2015/0347058 A1* | 12/2015 | Lam .................. | G06F 3/0688 711/103 |
| 2018/0336035 A1* | 11/2018 | Choi ................. | G06F 9/35 |

OTHER PUBLICATIONS

U.S. Appl. No. 15/395,415, by Luis Vitorio Cargnini et al., filed Dec. 30, 2016.

Lawrie, "Access and Alignment of Data in an Array Processor," IEEE Transactions on Computers, vol. c-24, No. 12, Dec. 1975, pp. 1145-1155.

Hall et al., "A Compact Programmable Array Processor", The Lincoln Laboratory Journal, vol. 2, No. 1, 1989, 22 pgs. Applicant points out, in accordance with MPEP 609.04(a), that the year of publication, 1989, is sufficiently earlier than the effective U.S. filing date, Dec. 30, 2016, so that the particular month of publication is not in issue.

Lawrie, "Access and Alignment of Data in an Array Processor", IEEE Xlore Abstract, Retrieved on Apr. 1, 2016 from http://ieeexplore.ieee.org/xpl/login.jsp?tp=&arnumber=1672750&url=http%3A%2F%2Fieeexplore.ieee.org%2Fxpls%2Fabs_all.jsp%3Farnumber%3D1672750, Citing the Abstract Only, 2 pgs.

Mueller et al., "Data Processing on FPGAs", VLDB '09, Aug. 24-28, 2009, 12 pgs.

Patterson et al., "Intelligent RAM (IRAM): the Industrial Setting, Applications, and Architectures", IEEE, Jan. 1997, 6 pgs.

Howson, InformationWeek—Take Advantage of In-Memory Analytics, Apr. 20, 2009, Retrieved from http://www.informationweek.com/software/information-management/take-advantage-of-in-memory-analytics/d/d-id/1078734?print=yes, 5 pgs.

Howarth, "In-memory computing" CIO, Jan. 20, 2011, Retrieved from http://www.cio.com.au/article/print/373945/in-memory_computing/, 2 pgs.

Patterson et al., "FP 14.1 Intelligent RAM (IRAM): Chips that remember and compute", ISSCC97, 1997, 2 pgs. Applicant points out, in accordance with MPEP 609.04(a), that the year of publication, 1997 is sufficiently earlier than the effective U.S. filing date, Dec. 30, 2016, so that the particular month of publication is not in issue.

Rouse, processing in memory (PIM), SearchBusinessAnalytics.com, Jan. 25, 2011, Retrieved from http://searchbusinessanalytics.techtarget.com/definition/processing-in-memory-PIM?vgnextfmt=print, 1 pg.

Von Neumann bottleneck, WhatIs.com, Feb. 2, 2011, Retrieved from http://whatis.techtarget.com/definition/von-Neumann-bottleneck?vgnextfmt=print, 1 pg.

U.S. Appl. No. 14/922,547, filed Oct. 26, 2015 by Zvonimir Bandic et al.

U.S. Appl. No. 14/924,670, filed Oct. 27, 2015 by Zvonimir Bandic et al.

* cited by examiner

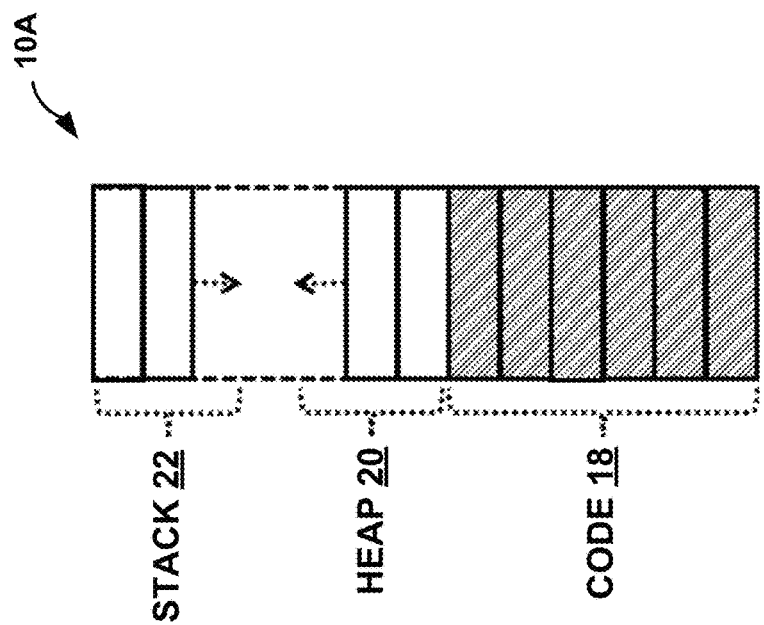
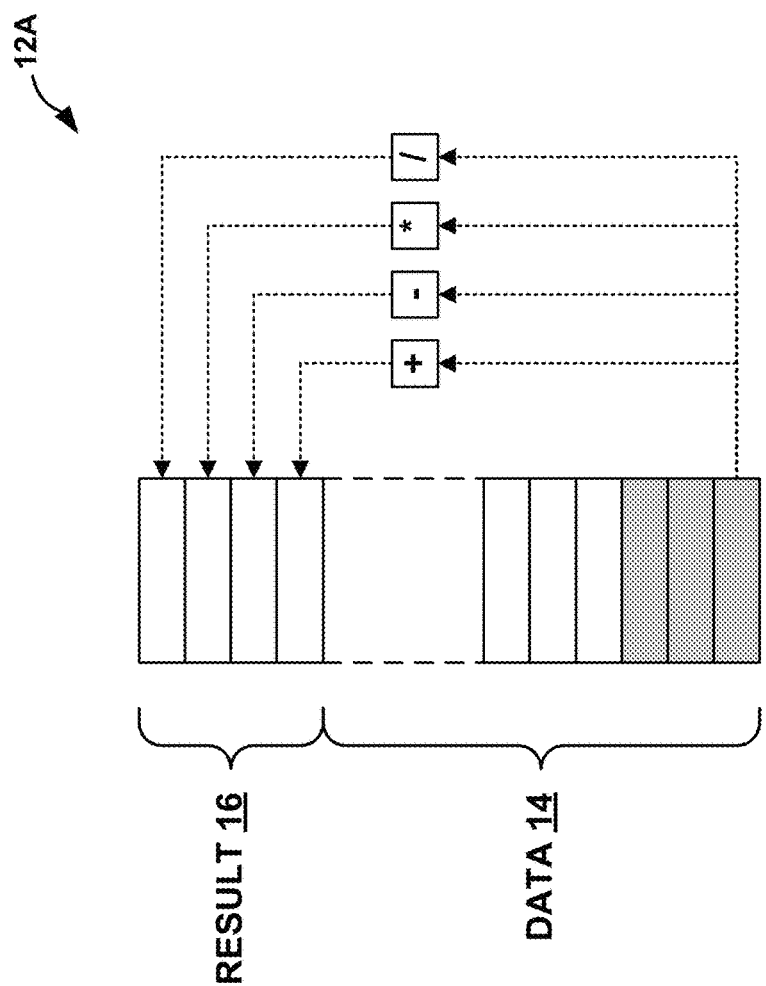

PROCESSOR IN NON-VOLATILE STORAGE MEMORY

BACKGROUND

Memory devices used in all the existing devices, in consumer, industrial, military and aeronautical space may be composed of non-volatile memory or volatile memory. The main difference between non-volatile memory and volatile memory is that non-volatile memory can retain data without requiring a persistent power supply. Typically, data may be read from non-volatile memory, transferred and stored temporarily in volatile memory, then manipulated using processing units, and the results are stored back in the non-volatile memory. In general, it may be desirable to increase the overall speed of the above operations. However, transferring the data from the non-volatile memory to the volatile memory for data manipulation may be limited in speed by hardware bandwidth (e.g., the Von Neumann bottleneck where for example, instruction fetch and data operation cannot occur at the same time over a shared memory bus). Thus, there is a continual need for a new processing unit and memory architecture to overcome this limitation.

SUMMARY

In one example, a computing system includes a device, the device including: a non-volatile memory divided into a plurality of selectable locations, each bit in the non-volatile memory configured to have corresponding data independently altered, wherein the selectable locations are grouped into a plurality of data lines; and one or more processing units coupled to the non-volatile memory, each of the processing units associated with a data line of the plurality of data lines, and each of the processing units configured to compute, based on data in an associated data line of the plurality of data lines, corresponding results, wherein the non-volatile memory is configured to selectively write, based on the corresponding results, data in selectable locations of the associated data line reserved to store results of the computation from the process unit associated with the associated data line.

In another example, a method includes computing, by a particular processing unit of one or more processing units coupled to a non-volatile memory that is divided into a plurality of selectable locations that are grouped into a plurality of data lines and based on data in a particular data line of the plurality of data lines that is associated with the processing unit, corresponding results, wherein each selectable location in the non-volatile memory configured to be independently programmed and erased, wherein each processing unit of the processing units is associated with a data line of the plurality of data lines, and wherein the one or more processing units and the non-volatile memory are included on the same chip. In this example, the method further includes selectively altering, based on the corresponding results, data in selectable locations of the particular data line reserved to store results of the computation from the process unit associated with the particular data line.

In another example, a processor in memory device includes a plurality of means for computing, based on data in data lines that each include one or more selectable locations of a non-volatile memory that is divided into a plurality of selectable locations, corresponding results, wherein each selectable location in the non-volatile memory configured to be independently programmed and erased, wherein each of the plurality of means for computing is associated with a data line of the plurality of data lines, and wherein the plurality of means for computing and the non-volatile memory are included on the same chip; and means for selectively altering, based on the corresponding results, data in selected locations of the data lines reserved to store results of the computation from the means for computing associated with the data line.

The details of one or more examples of the techniques described in this disclosure are set forth in the accompanying drawings and the description below. Other features, objects, and advantages of the techniques will be apparent from the description and drawings, and from the claims.

BRIEF DESCRIPTION OF DRAWINGS

FIG. 5 is a conceptual diagram illustrating an example data line that may be included in a PiNVSM device, in accordance with one or more techniques of this disclosure.

FIG. 6 is a conceptual diagram illustrating an example code line that may be included in a PiNVSM device, in accordance with one or more techniques of this disclosure.

DETAILED DESCRIPTION

Figure 1:
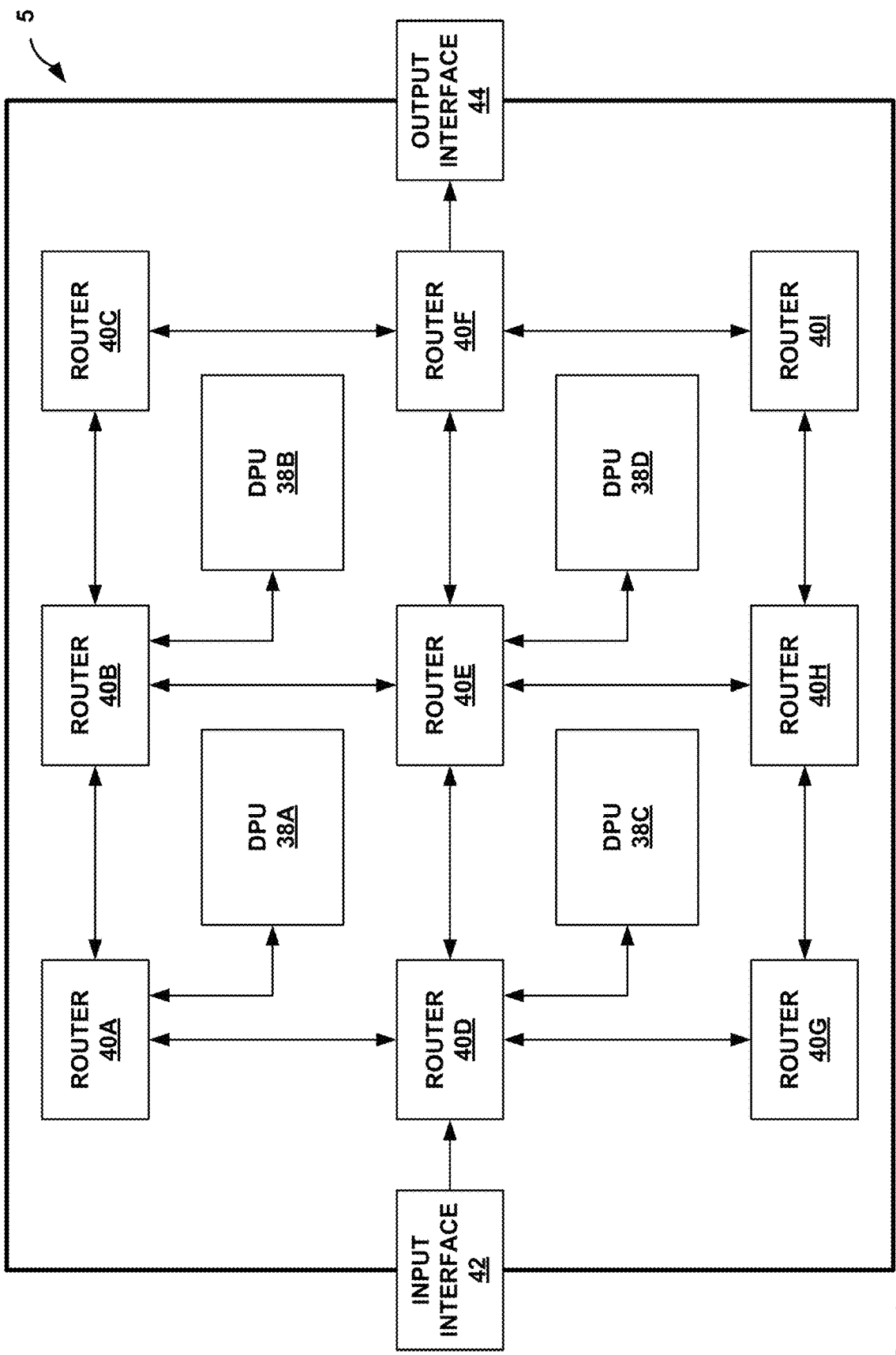
FIG. 1 is a conceptual and schematic block diagram illustrating an example system that includes a plurality of processor in non-volatile storage memory (PiNVSM) devices, in accordance with one or more techniques of this disclosure.

In accordance with one or more techniques of this disclosure, a computer architecture is proposed in which a processing unit includes persistent data storage and may process data in-place. For instance, a processor in non-volatile storage memory (PiNVSM) device on a chip may be able to persistently store large amounts of data persistently and to process the persistently stored data in-place. As both the one or more processing units and the NVSM are included on the same chip, the rate at which the one or more processing units may access data stored by the NVSM (i.e., latency) may be reduced. For the purpose of illustration, a PiNVSM device may be a single semiconductor chip and may include a data processing unit connected to an associated memory subarray of non-volatile memory. A PiNVSM system may include a plurality of PiNVSM devices connected to each other in various configurations via various communication buses or channels (wired or wireless). In this way, a PiNVSM device may avoid memory bandwidth limitation issues, such as the Von Neumann bottleneck.

Mathematical computational operations and/or logic operations, using mathematical computational functionality and/or logic functionality, may be performed by the PiNVSM device using one or more processing units. In some examples, the PiNVSM device includes one or more arithmetic logic units (ALUs). As discussed in more detail below, the ALUs may each be configured to perform integer arithmetic and logical operations (e.g., AND, NAND, OR, NOR, XOR, NOT). In some examples, the PiNVSM device may include one or more floating point units (FPUs), which may each be configured to perform non-integer calculations, such as division operations, which may generate a fraction, or a "floating point" number. In some examples, the PiNVSM device may include both one or more processing units (PU), and one or more field-programmable gate arrays (FPGAs). Processing units in some embodiments may be pre-fabricated in hardware to perform specific computations or data manipulations. For example, the processing units may be pre-fabricated with only specific circuit logic (such as ASICs) to perform a specific calculation. Alternatively, processing units may be programmable processing units that can be programmed in the field to perform computations or data manipulations based on execution codes. For example, such processing units may include FPGAs, programmable ALUs, etc.

In the NVSM, programming and erasing of data may be performed at the selectable location level. For instance, the NVSM may be divided into a plurality of selectable locations and the processing units may be able to program data or erase data at a particular selectable location of the plurality of selectable locations without altering data stored at other selectable locations of the plurality of selectable locations. Some examples of NVSM include, but are not necessarily limited to, magnetoresistive random-access memory (MRAM), ferroelectric random-access memory (FeRAM), NRAM, resistive random-access memory (ReRAM), Phase Change Memory (PCM), Mott memory, and the like.

In some examples, the selectable locations may be addressable locations. For instance, each of the selectable locations may have a unique numerical address, and data at a particular addressable location may be accessed/read/written via a unique address of the particular addressable location. In some examples, data at a particular addressable location may be accessed/read/written via an access system.

In operation, one or more processing units of a PiNVSM device may perform data manipulation based on data in selected locations of non-volatile memory of the PiNVSM device, generate corresponding results of the data manipulation, and cause the non-volatile memory to selectively program and erase data in selectable locations reserved to store results of the data manipulation based on the corresponding results. As the programming and erasing of data may be performed at the selectable location level, the one or more processing units may cause the non-volatile memory to selectively program and erase data in selectable locations reserved to store results of the data manipulation without altering data stored at selectable locations other than the selectable locations reserved to store results of the data manipulation.

As discussed above, a PiNVSM device may include one or more processing units. For instance, a PiNVSM device may include one or more dedicated processing units that may perform arbitrary operations. Examples of dedicated processing units include, but are not necessarily limited to, Arithmetic Logic Units (ALUs), Processing Units (PU), Field Programmable Gate Arrays (FPGA), fully custom logic, and Floating Point Units (FPUs).

In some examples, the non-volatile memory space may be shared between data lines and code lines. In general, a data line may include user data. A code line may include an instruction set (i.e., a software primitive, execution code) that can be used for manipulation of data lines. Each of the data lines may include one or more selectable locations and may be associated with a processing unit. In other words, the selectable locations of the non-volatile memory may be grouped into a plurality of data lines. In some examples, at any given time, a particular selectable location may only be grouped into a single data line. As such, in some examples, the PiNVSM device may have a unique mapping between selectable locations and data lines (or code lines) such that a single selectable location is not included in two data lines (or two code lines) at the same time.

In some examples, the grouping of selectable locations into data lines may be adjustable overtime. For instance, at a first time, a first group of selectable locations of a plurality of selectable locations may be associated with a particular data line that is associated with a particular processing unit. At a second time, a second group of selectable locations of the plurality of selectable locations may be associated with the particular data line. The second group of selectable locations may be different than the first group of selectable locations (i.e., include a selectable location not included in the first group and/or omit a selectable location included in the first group).

In operation, the instruction sets may be used to manipulate data lines with varying frequencies. For instance, a first instruction set may be used to manipulate a data line twice as often as a second instruction set. As such, it may be desirable for the PiNVSM device to be able to manipulate data based on the most frequently used instruction sets at a faster rate and/or with lower power consumption than less frequently used instruction sets.

Additionally, a PiNVSM device may, in accordance with various aspects of the techniques described in this disclosure, include one or more programmable processing units programmed to manipulate data using the most frequently used instruction sets. For instance, where a particular instruction set is the most frequently used instruction set, the PiNVSM device may program the one or more programmable processing units to manipulate data using the particular instruction set. During operation, the one or more programmable processing units may manipulate data using the particular instruction set. In this way, the non-volatile storage device may to be able to manipulate data based on the most frequently used instruction sets at a faster rate and/or with lower power consumption than less frequently used instruction sets.

The usage frequency of the instruction sets may not be consistent over time. For example, a first instruction set may have a higher usage frequency than a second instruction set at a first time while the second instruction set may have a higher usage frequency than the first instruction set at a second time. In accordance with one or more techniques of this disclosure, the programming of the one or more programmable processing units may be adaptive. For instance, the PiNVSM device may monitor the usage frequency of a plurality of instruction sets and periodically re-program the one or more programmable processing units to manipulate data using the currently most frequently used instruction sets. In this way, the PiNVSM device may self-optimize.

FIG. 1 is a conceptual and schematic block diagram illustrating an example system that includes a plurality of processor in non-volatile storage memory (PiNVSM) devices, in accordance with one or more techniques of this disclosure. For the purpose of illustration, a PiNVSM device may be a single semiconductor chip and may include a data processing unit connected to an associated memory subarray of non-volatile memory. As shown in FIG. 1, computing system 5 may include one or more data processing units (DPUs) 38A-38D (collectively, "DPUs 38"), one or more routers 40A-40I (collectively, "routers 40"), input interface 42, and output interface 44. In some examples, computing system 5 may be a standalone computing system in that a separate host device may not be present. For instance, computing system 5 may not follow a traditional Von Neumann architecture.

Input interface 42 may be configured to obtain input data. For instance, input interface 42 may obtain digital audio data, digital video data, text data (i.e., entered via keyboard), position data (i.e., entered via a mouse), and any other type of digital data.

Output interface 44 may be configured to provide output data. For instance, output interface 44 may output digital audio data, digital video data, one or more management actions, and any other type of output data.

Routers 40 may each be configured to route data around computing system 5. In some examples, routers 40 may form a network on chip (NoC) architecture, such as the NoC architecture discussed in U.S. patent application Ser. No. 14/922,547 Titled "Fabric Interconnection for Memory Banks Based on Network-On-Chip Methodology" filed on Oct. 26, 2015 and/or U.S. patent application Ser. No. 14/927,670 Titled "Multilayer 3D Memory Based on Network-On-Chip Interconnection" filed on Oct. 27, 2015. As shown in FIG. 1, routers 40 may be interconnected via wires, traces, or any other conductive means. Routers 40 may route data and/or instructions around computing system 5. For instance, routers 40 may enable the transport/transfer/exchange of data and/or instructions amongst DPUs 38, input interface 42, and/or output interface 44. By enabling a NoC architecture, routers 40 may enable a reduction in a size of computing system 5 (i.e., as separate tracks between components may be eliminated).

DPUs 38 may each be configured to store and process data. DPUs 38 may include a plurality of PiNVSM devices in that each of DPUs 38 may include one or more processing units and a non-volatile memory array. For the purpose of illustration, a PiNVSM device may be a single semiconductor chip and may include a data processing unit connected to an associated memory subarray of non-volatile memory. Further details of an example DPU of DPUs 38 are discussed below with reference to FIG. 2.

In operation, processing units of DPUs 38 may perform data manipulation based on data in selected locations of NVMA included in DPUs 38 to generate corresponding results of the data manipulation. For instance, each of the processing units included in DPUs 38 may be configured to compute results for data in an associated data lines. As one example, a particular processing unit included in a DPU of DPUs 38 may be configured to compute results for data in a data line associated with the particular processing unit. The results of the computation may be stored in the associated data lines reserved for the results. Initial data used for the computation are only overwritten when specifically intended for overwrites. The processing units may cause NVMAs included in DPUs 38 to selectively program and erase data in selectable locations reserved to store results of the data manipulation based on the corresponding results. For instance, each of the processing units included in DPUs 38 may be configured to selectively write, based on the corresponding results, data in a results portion of an associated data line. As one example, a particular processing unit included in a DPU of DPUs 38 may be configured to store results in a results portion of a data line associated with the particular processing unit.

In some examples, the processing units may perform the data manipulation based on instruction sets, such as execution code. As discussed below, in some examples, the instruction sets are stored by DPUs 38 as code lines, such as code line 10A of FIG. 4. In some examples, the execution code in each of the code lines may contain a sequence of instructions. In some examples, a management unit may be configured to obtain the instruction sets.

As discussed below, because the instruction sets may be used to manipulate data lines with varying frequencies, it may be desirable for DPUs 38 to be able to manipulate data based on the most frequently used instruction sets at a faster rate and/or with lower power consumption than less frequently used instruction sets.

In accordance with one or more techniques of this disclosure, one or more programmable processing units included in DPUs 38 may be programmed to manipulate data using the most frequently used instruction sets. Examples of programmable processing units that may be included in DPUs 38 include, but are not limited to, FPGAs, lookup tables, vectors for vectorial processing, ASICs, logic blocks (e.g., a simple adder or a Gaussian mixture block, more or less specialized blocks) that manipulate data in one specific way (e.g., there may be multiple blocks and programming involves activating the blocks that perform the programmed function and powering down other blocks, i.e., to increase performance and control power consumption), and any similar structure that may be programmed or configured to manipulate data in a certain way. In this way, DPUs 38 may manipulate data based on the most frequently used instruction sets at a faster rate and/or with lower power consumption than less frequently used instruction sets.

The usage frequency of the instruction sets may not be consistent over time. For example, a first instruction set may have a higher usage frequency than a second instruction set at a first time while the second instruction set may have a higher usage frequency than the first instruction set at a second time. In accordance with one or more techniques of this disclosure, the programming of the one or more programmable processing units of DPUs 38 may be adaptive. For instance, a management unit of each of DPUs 38 may monitor the usage frequency of a plurality of instruction sets (i.e., how often DPUs 38 use the instruction sets) and periodically re-program the one or more programmable processing units to manipulate data using the currently most frequently used instruction sets. In this way, DPUs 38 may self-optimize. Further details of optimization are discussed below with reference to FIG. 12.

In some examples, to determine which of the instruction sets are most frequently used to manipulate data, computing system 5 may maintain a queue (or a plurality of queues, which may be in-order queues or out-of-order queues) that includes, for respective instruction sets, a respective usage value that indicates a relative frequency at which the respective instruction set is used to manipulate data. Management Unit may select a group of instruction sets from the queue with the highest respective usage values as the most frequently used instruction sets for programming the one or more programmable processing units of DPUs 38. Further details of one example of the queue are discussed below with reference to FIGS. 13-17.

In some examples, a dedicated processing unit of one or more dedicated processing units of DPUs 38 may take longer to manipulate data based on a particular instruction set than a programmable processing unit of one or more programmable processing units of DPUs 38 takes to manipulate data based on the same particular instruction set. In some examples, time may be non-deterministic and may not synchronized across the multiple processing units like in Globally Asynchronous Locally Synchronous (GaLs) devices.

Figure 2:
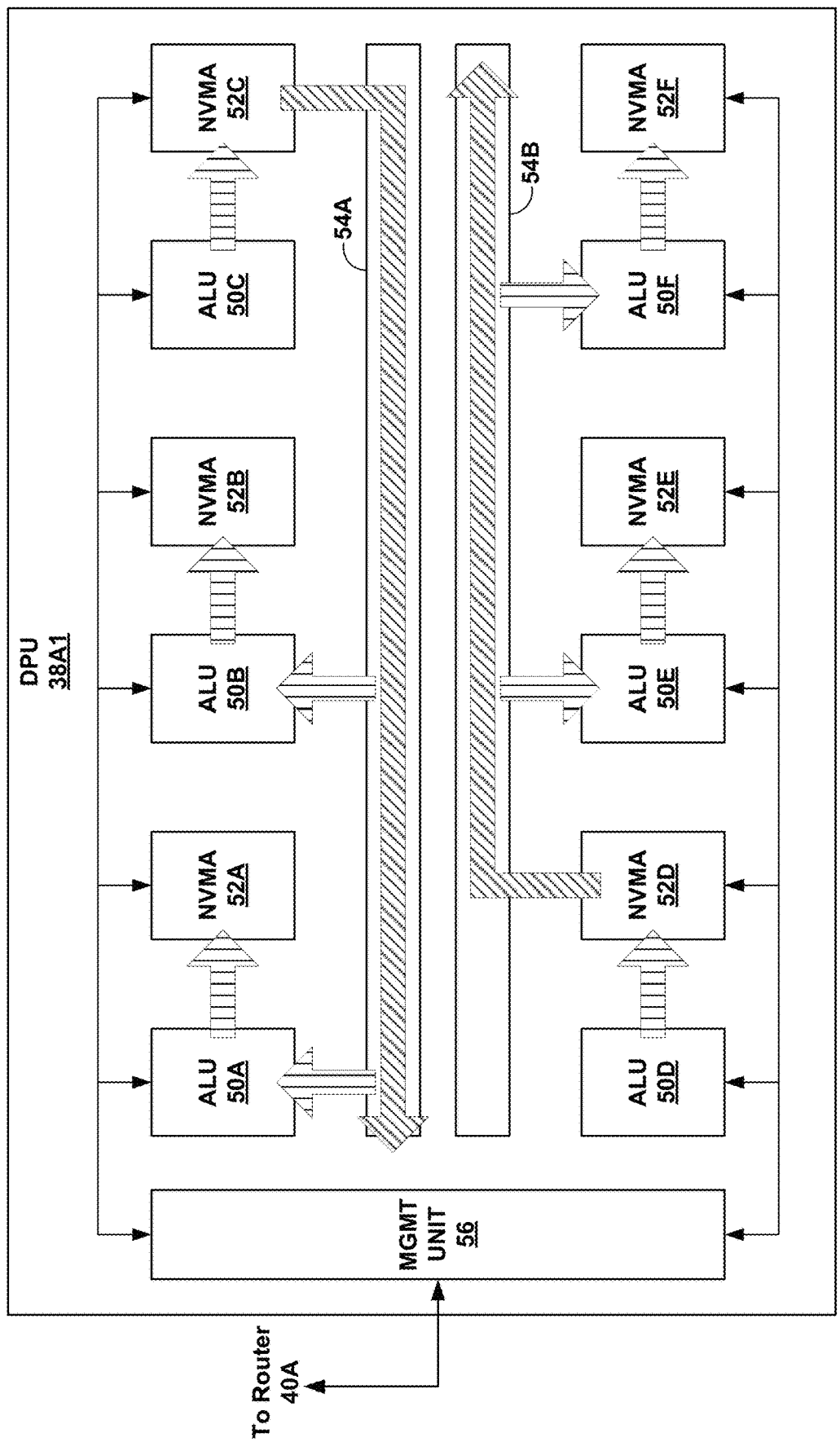
FIG. 2 is a block diagram illustrating further details of an example data processing unit (DPU), in accordance with one or more techniques of this disclosure.

FIG. 2 is a block diagram illustrating further details of an example data processing unit (DPU), in accordance with one or more techniques of this disclosure. DPU 38A1 in FIG. 2 may be an example of DPU 38A of FIG. 1. As shown in FIG. 2, DPU 38A1 includes arithmetic logic units (ALUs) 50A-50F (collectively, ALUs 50"), non-volatile memory arrays (NVMAs) 52A-52F (collectively, "NVMAs 52"), NVMAs 54A and 54B (collectively, "NVMAs 54"), and management unit 56. For the purpose of illustration, a PiNVSM device may be a single semiconductor chip and may include a data processing unit (such as one of the ALUs 50A-50F) connected to an associated memory subarray of non-volatile memory (such as associated one of the NVMAs 52A-52F).

Management unit 56 may be configured to control operation of one or more components of DPU 38A1. As shown in FIG. 2, management unit 56 may control operation of ALUs 50, NVMAs 52, and NVMAs 54. Management unit 56 may communicate with one or more components external to DPU 38A1, such as router 40A of FIG. 1.

NVMAs 52 may each represent an array of non-volatile memory that may be programmed and erased at the selectable location without altering data stored at other selectable locations. In some examples, NVMAs 52 may include any type of non-volatile memory device that may perform selectable location level programming and erasing without altering data stored at other selectable levels. For example, each bit in NVMAs 52 may be independently alterable without altering data stored in other bits in NVMAs 52. That is, NVMAs 52 may be configured to write a "0" or a "1" (or alter the storage state) of any single bit without changing any other accessible bit in normal operations. In some granularities, NVMAs 52 may be configured to be byte-wise alterable, word-wise alterable, double-word-wise alterable, quad-word-wise alterable, etc. This effectively allows the NVMAs 52 to have data overwritten in any granularity down to a single bit location, without the necessity of having to first "erase" an entire block of bits (as in traditional Flash Memory). In some examples, NVMAs 52 may be storage class memory. Some examples, of NVMAs 52 include, but are not limited to phase-change memory (PCM) devices, resistive random-access memory (ReRAM) devices, magnetoresistive random-access memory (MRAM) devices, ferroelectric random-access memory (FeRAM), holographic memory devices, and any other type of non-volatile memory devices capable of being written to at a location level without altering data stored at other selectable levels.

In some examples, NVMAs 52 and 54 may use multiple levels of granularity to access data (i.e., without the need to have fixed page sizes). For instance, in each of the selectable locations, NVMAs 52 and 54 may work with pages, without pages, with 4K, 6K, 18K, etc., blocks of data, or 64 bytes, 128 bytes, 256 bytes, etc. at a time. In some examples, an NVMA of NVMAs 52 and 54 may modify its internal organization on-the-fly. For instance, in each of the selectable locations, an NVMA of NVMAs 52 and 54 may change partitions, change banks organization, data line association, addressable area, accessible area, and/or blocks size.

NVMAs 54 may each represent an array of non-volatile memory that may be programmed and erased at the selectable location level without altering data stored at other selectable locations. In some examples, NVMAs 54 may be used as an execution conveyor.

ALUs 50 may be configured to manipulate data stored within NVMAs 52. For instance, each respective ALU of ALUs 50 may be configured to manipulate data within a corresponding NVMA of NVMAs 52. In particular, ALU 50A may be configured to manipulate data within NVMA 52A, ALU 50B may be configured to manipulate data within NVMA 52B, . . . , and ALU 50F may be configured to manipulate data within NVMA 52F. In some examples, each ALU of ALUs 50 may be an elementary ALU.

The horizontally shaded arrows in FIG. 2 may represent a management and execution flow amongst the components of DPU 38A 1. Similarly, the diagonally shaded arrows in FIG. 2 may represent instruction set flows amongst the components of DPU 38A1.

Figure 3:
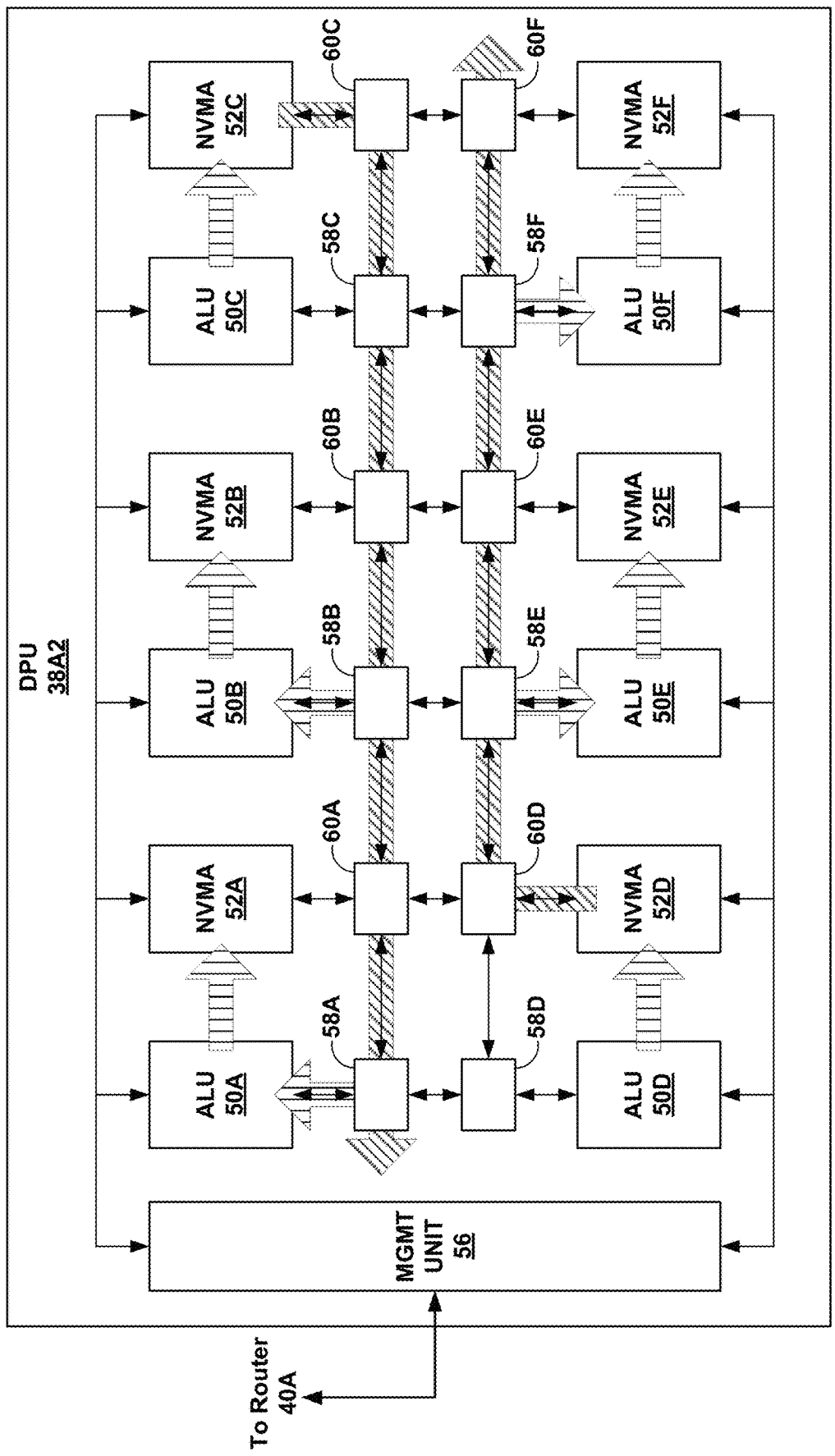
FIG. 3 is a block diagram illustrating further details of an example data processing unit (DPU), in accordance with one or more techniques of this disclosure.
Figure 13:
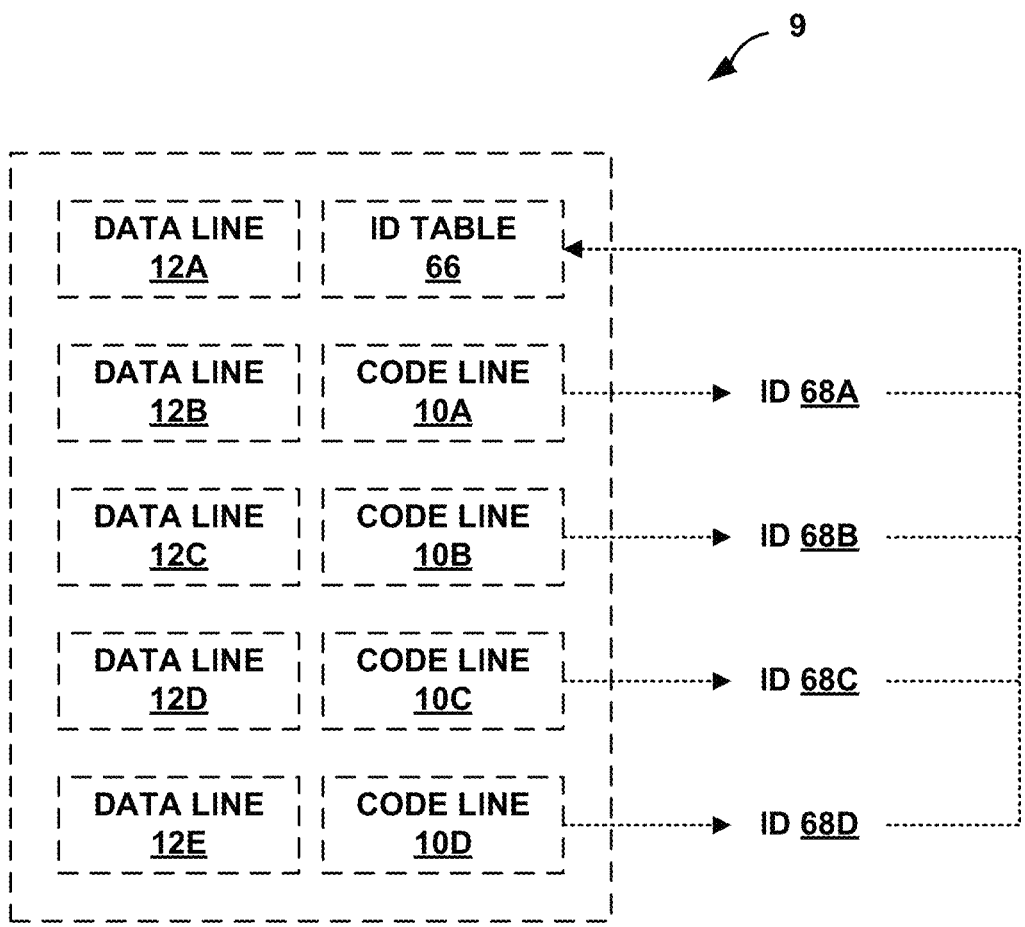
FIG. 13 is a conceptual diagram illustrating an example storage space of a non-volatile storage device, in accordance with one or more techniques of this disclosure.

FIG. 3 is a block diagram illustrating further details of an example data processing unit (DPU), in accordance with one or more techniques of this disclosure. DPU 38A2 in FIG. 3 may be another example of DPU 38A of FIG. 1. Similar to DPU 38A1, DPU 38A2 includes ALUs 50, NVMAs 52, and management unit 56. In addition, DPU 38A2 includes a first plurality of routers 58A-58F (collectively, "routers 58"), and a second plurality of routers 60A-60F (collectively, "routers 60"). As shown in FIG. 13, DPU 38A2 may not include NVMAs 54.

Routers 58 and routers 60 may function as a network-on-chip (NoC) within DPU 38A2 to move data amongst components of DPU 38A2. For instance, routers 58 and routers 60 may move data amongst ALUs 50 and/or NVMAs 52. In some examples, routers 58 and routers 60 may operate on different channels and/or different operating protocols and frequencies, according to different priorities.

Similar to the example of FIG. 2, the horizontally shaded arrows in FIG. 3 may represent a management and execution flow amongst the components of DPU 38A2 and the diagonally shaded arrows in FIG. 3 may represent instruction set flows amongst the components of DPU 38A2.

Figure 4:
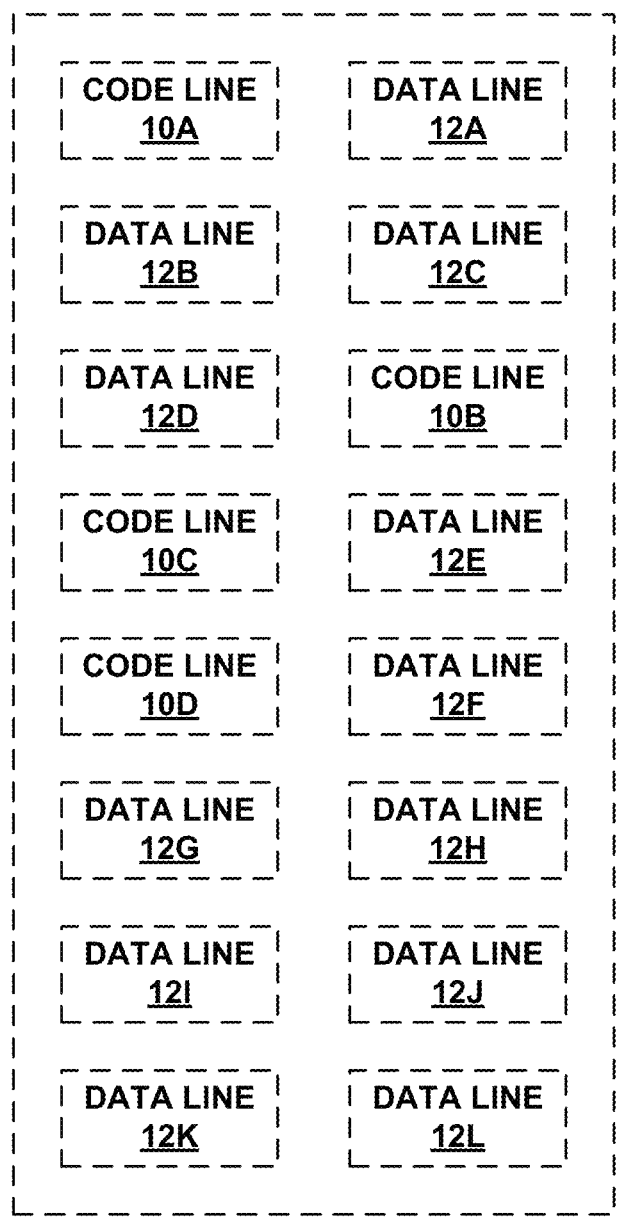
FIG. 4 is a conceptual diagram illustrating an example storage space of a PiNVSM device, in accordance with one or more techniques of this disclosure.

FIG. 4 is a conceptual diagram illustrating an example storage space of a PiNVSM device, in accordance with one or more techniques of this disclosure. As shown in FIG. 4, storage space 8 includes code lines 10A-10D (collectively, "code lines 10"), and data lines 12A-12L (collectively, "data lines 12"). As discussed above, data lines 12 may each include some user data. For instance, each data line of data lines 12 may be an array of data items with associated operations. Also as discussed above, code lines 10 may each include an instruction set (i.e., a software primitive, execution code) that can be used for manipulation of user data of data lines 12. In other words, a code line of code lines 10 may be a sequence of operations with the prepared environment that can be used for transformation of user data of data lines 12.

In some examples, code may be simply stored as data and it can be treated as a data line. Otherwise, the code may be copied into a particular location (e.g., a special place or execution conveyor, for example) that will be treated as a sequence of instructions (code line 10). After being used to manipulate data, a code line of code lines 10 may be transformed in data line of data lines 12 that will store results of the data manipulation and/or executable code.

FIG. 5 is a conceptual diagram illustrating an example data line that may be included in a PiNVSM device, in accordance with one or more techniques of this disclosure. As shown in FIG. 5, data line 12A includes data portion 14 and results portion 16. Data portion 14 may correspond to one or more selectable locations of a PiNVSM device that store data, such as one or more selectable locations of an NVMA of NVMAs 52 of FIG. 2. Results portion 16 may correspond to one or more selectable locations of the non-volatile storage device that store results of manipulation of data, such as data stored in data portion 14. Data line 12A may be a logical structure and the selectable locations of data portion 14 and/or results portion 16 may or may not be contiguously located (meaning, in other words, may or may not have sequential physical addresses). The selectable locations that correspond to data portion 14 and the selectable locations that correspond to results portion 16 may be considered to be grouped into data line 12A.

FIG. 6 is a conceptual diagram illustrating an example code line that may be included in a PiNVSM device, in accordance with one or more techniques of this disclosure. As shown in FIG. 6, code line 10A includes code portion 18, heap portion 20, and stack portion 22. Code portion 18 may correspond to one or more selectable locations of a non-volatile storage device that store an instruction set (e.g., a software primitive) that may be used to manipulate data. Heap portion 20 and stack portion 22 may each correspond to one or more selectable locations of a non-volatile storage device respectively used as a heap and a stack during data manipulation. Code line 10A may be a logical structure and the selectable locations of code portion 18, heap portion 20, and/or stack portion 22 may or may not be contiguously located (meaning, in other words, that these portions 18-22 may or may not be stored to memory locations having have sequential physical addresses).

Figure 7:
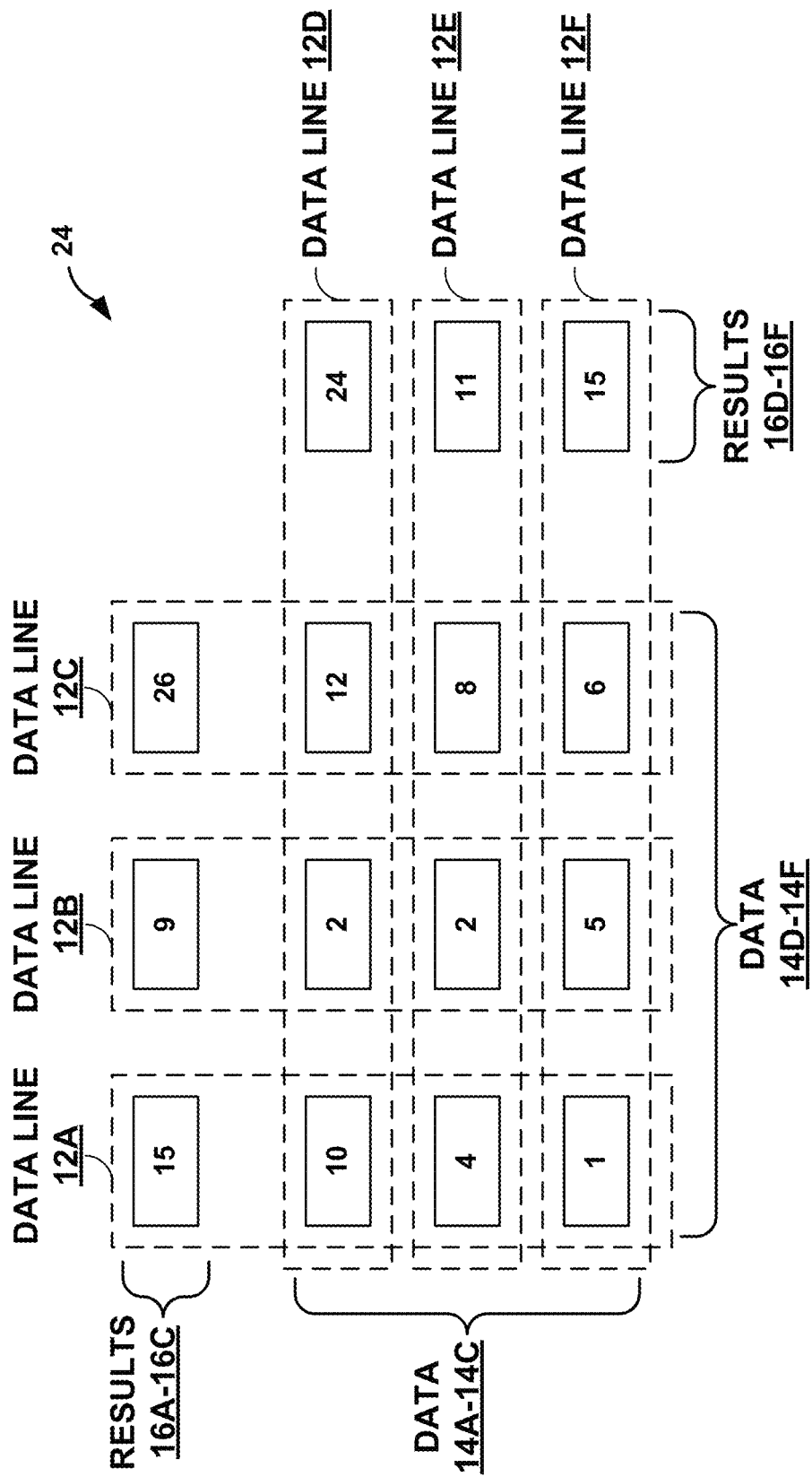
FIG. 7 is a conceptual diagram illustrating an example arrangement of data lines included in a PiNVSM device, in accordance with one or more techniques of this disclosure.

FIG. 7 is a conceptual diagram illustrating an example arrangement of data lines included in a PiNVSM device, in accordance with one or more techniques of this disclosure. In some examples, a plurality of data lines may form a database table, such as Table 1 below, in which values in the database table are stored in data portions of the data lines and results of operations on the values of the database table are stored in results portion in the data lines.

TABLE 1

|  | Goods #1 | Goods #2 | Goods #3 | Total |
|---|---|---|---|---|
| Date #1 | 4 | 5 | 6 | 15 |
| Date #2 | 1 | 2 | 8 | 11 |
| Date #3 | 10 | 2 | 12 | 24 |
| Total | 15 | 9 | 26 |  |

As shown in the example of FIG. 7, data lines 12A-12C form columns and data lines 12D-12F form rows of database table 24. As also shown in FIG. 7, the results of operations on the values of database table 24 are stored in respective results portions of data lines 12. For instance, a respective total of all the values in each respective column of database table 24 is stored in a respective results portion of results portions 16A-16C. Similarly, a respective total of all the values in each respective row of database table 24 is stored in a respective results portion of results portions 16D-16F.

Figure 8:
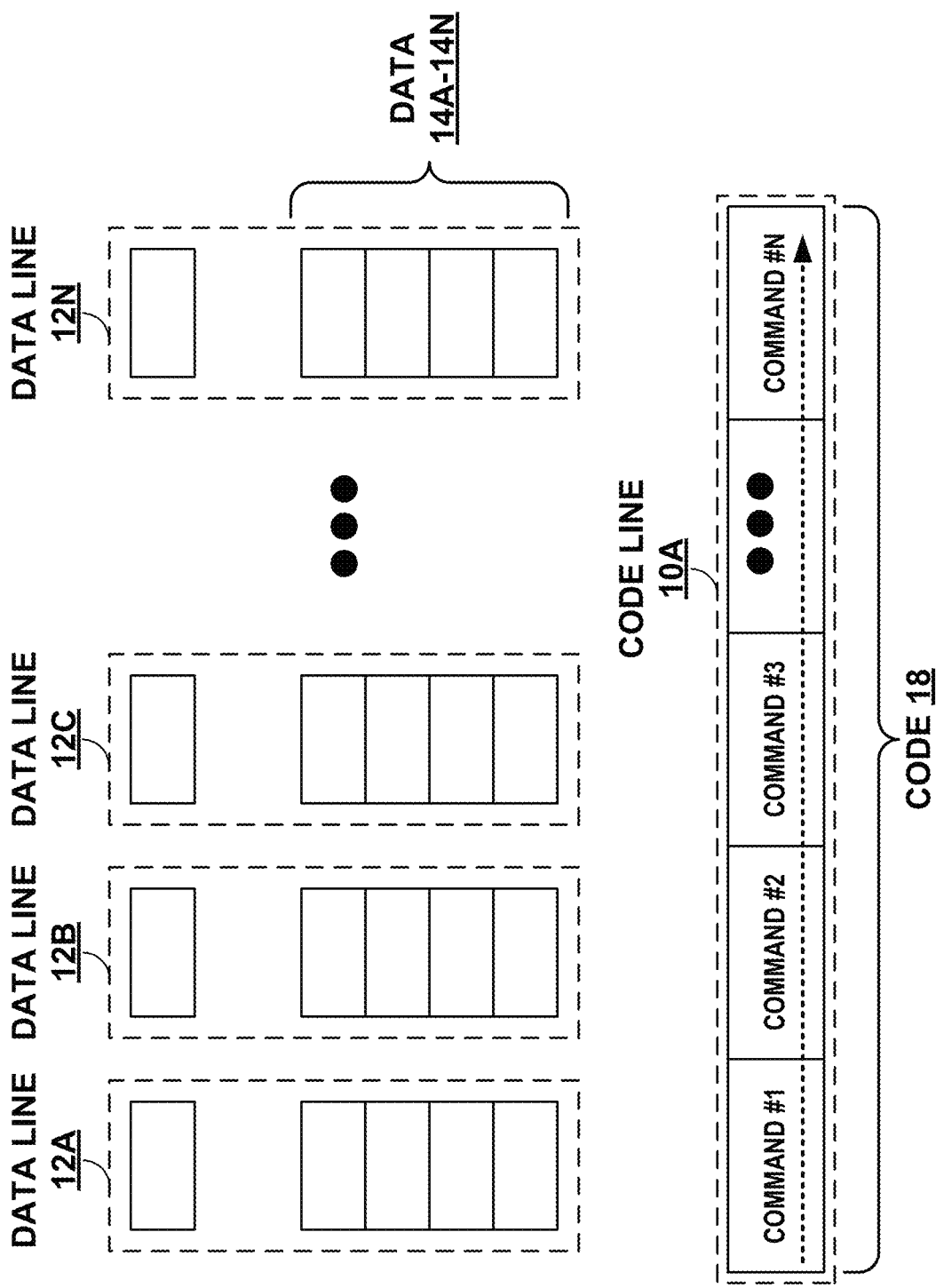
FIG. 8 is a conceptual diagram illustrating an example code line along with data lines of a PiNVSM device, in accordance with one or more techniques of this disclosure.

FIG. 8 is a conceptual diagram illustrating an example code line along with data lines of a PiNVSM device, in accordance with one or more techniques of this disclosure. As shown in FIG. 6, a sequence of commands in code line 10A (i.e., command #1, command #2, command #3, . . . , and command #N) may function as an execution conveyor. For instance, every command may describe one elementary operation in a sequential execution flow. Additionally, in some examples, a PiNVSM device may apply every command to different data lines in a concurrent manner. For instance, a management unit of DPUs 38 of FIG. 1 may concurrently apply command #1 to data line 12A, command #2 to data line 12B, command #3 to data line 12C, and command #N to data line 12N.

Figure 9:
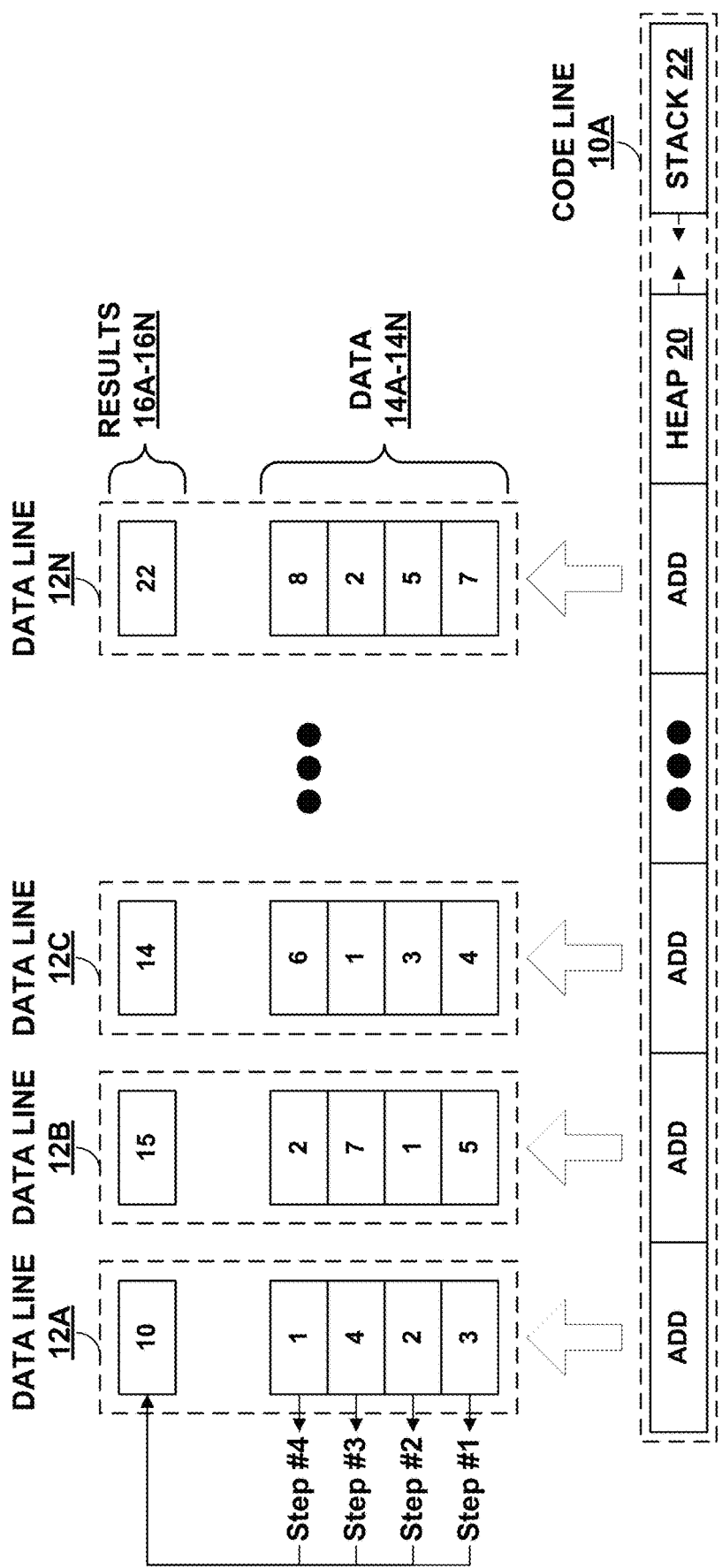
FIG. 9 is a conceptual diagram illustrating an example code line along with data lines of a PiNVSM device, in accordance with one or more techniques of this disclosure.

FIG. 9 is a conceptual diagram illustrating an example code line along with data lines of a PiNVSM device, in accordance with one or more techniques of this disclosure. As shown in FIG. 9, data lines 12A-12N may represent Table 2 shown below.

TABLE 2

|  | Goods #1 | Goods #2 | Goods #3 | . . . | Goods #N |
|---|---|---|---|---|---|
| Date #1 | 1 | 2 | 6 | . . . | 8 |
| Date #2 | 4 | 7 | 1 | . . . | 2 |
| Date #3 | 2 | 1 | 3 | . . . | 5 |
| Date #4 | 3 | 5 | 4 | . . . | 7 |
| Total | 10 | 15 | 14 | . . . | 22 |

As shown in the example of FIG. 9, data portions 14A-14N of data lines 12A-12N store the values of the columns of Table 2. As discussed above, it may be desirable to obtain a total of the values stored in each of the data portions 14A-14N of data lines 12A-12N (i.e., a total of the values in the columns of Table 2). In operation, one or more processing units of a PiNVSM device may manipulate the data stored in data portions 14A-14N of data lines 12A-12N based on a sequence of commands and store the results of the data manipulation in results portions 16A-16N of data lines 12A-12N. In the example of FIG. 9, the one or more processing units may manipulate the data stored in data portions 14A-14N of data lines 12A-12N based a sequence of commands defined by code line 10A. As shown in the example of FIG. 9, code line 10A contains the addition operation for every column (for every data line of data lines 12A-12N). The one or more processing units may apply the calculation operation (addition) several times from the first row to the last row in every column. In other words, the one or more processing units may repeat the addition operation in order to achieve the result of the whole code execution. The one or more processing units may store the results of the code execution (i.e., total in this example) in results portions 16A-16N of data lines 12A-12N.

Figure 10:
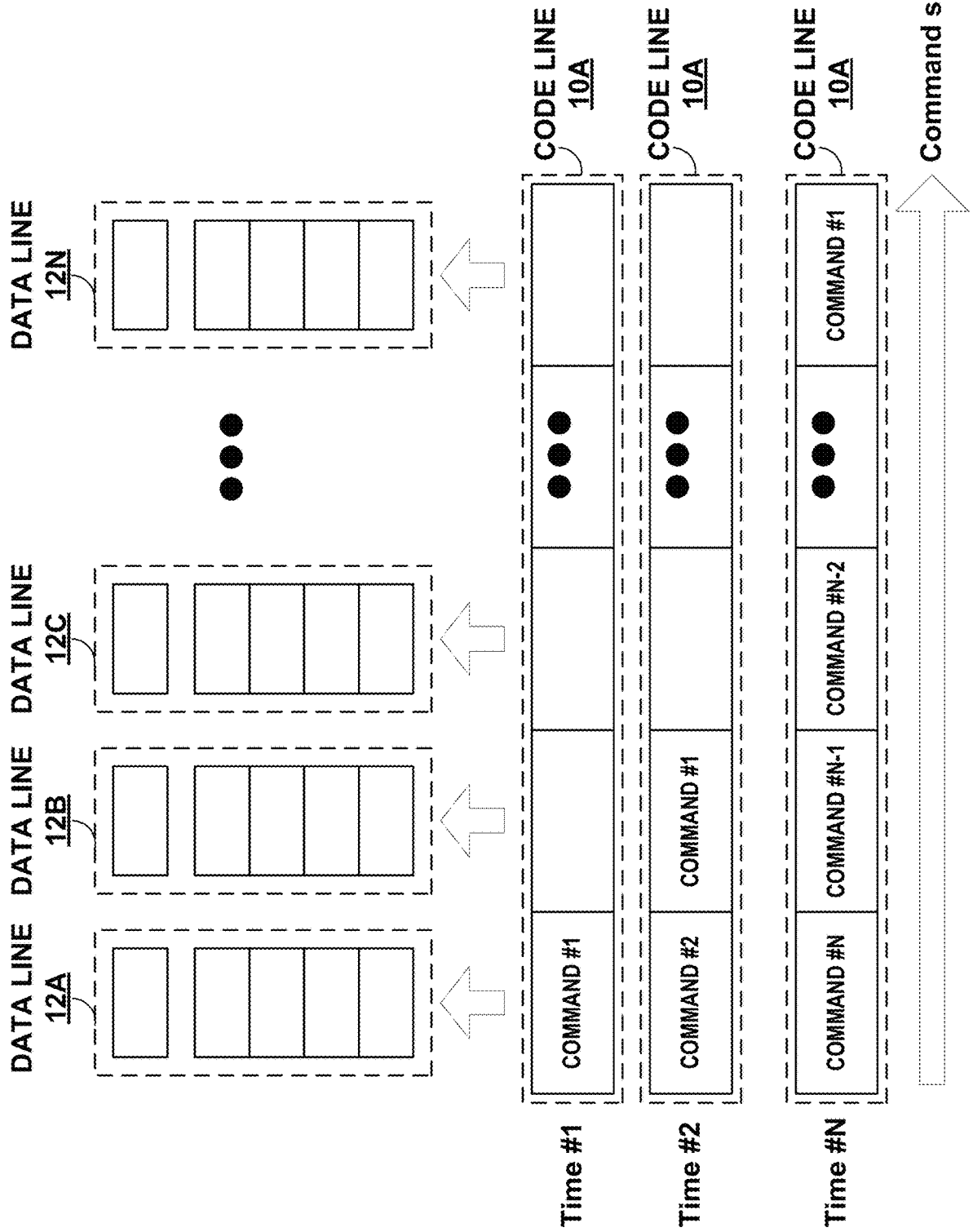
FIG. 10 is a conceptual diagram illustrating an example code line that may be executed with a command shift approach, in accordance with one or more techniques of this disclosure.

FIG. 10 is a conceptual diagram illustrating an example code line that may be executed with a command shift approach, in accordance with one or more techniques of this disclosure. In some examples, it may be desirable for one or more processing units of a PiNVSM device to manipulate data using relatively more complex operations (e.g., operations more complex that repeating a single operation on each value in a particular data line). In accordance with one or more techniques of this disclosure, a code line may define a sequence of commands that one or more processing units may sequentially apply to one or more data lines. For instance, as shown in FIG. 10 at time #1, one or more processing units may manipulate data in data line 12A based on command #1. At time #2, the one or more processing units may manipulate data in data line 12A based on command #2 and manipulate data in data line 12A based on command #1. At time #N, the one or more processing units may manipulate data in data line 12A based on command #N, manipulate data in data line 12B based on command #N−1, manipulate data in data line 12C based on command #N−2, and manipulate data in data line 12N based on command #1.

Figure 11:
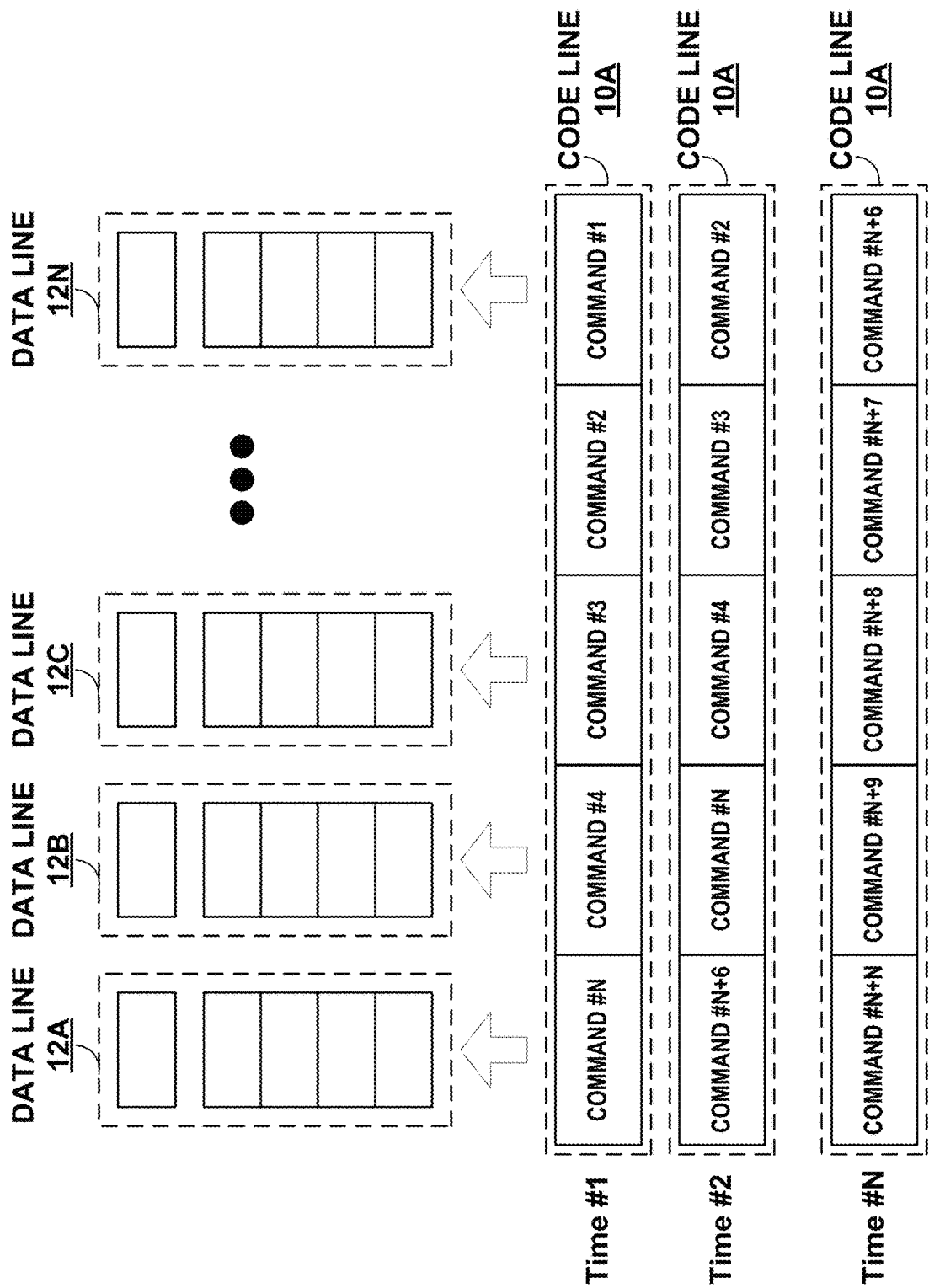
FIG. 11 is a conceptual diagram illustrating an example code line that includes a jump, in accordance with one or more techniques of this disclosure.

FIG. 11 is a conceptual diagram illustrating an example code line that includes a jump, in accordance with one or more techniques of this disclosure. In some examples, it may be desirable for one or more processing units of a PiNVSM device to jump to different commands in a code line when manipulating data. In accordance with one or more techniques of this disclosure, a code line may include one or more jump commands that cause the one or more processing units executing the code line to jump to a different position in the code line. In other words, in some examples, conditional and unconditional jumps in the code may be implemented by means of shift the sequence of commands on several positions at once to the right or left direction.

For instance, as shown in FIG. 11, one or more processing units of a PiNVSM device, such as DPU 38, may manipulate data in data line 12A based on command #N of code line 10A at time #1. Then, at time #2, the one or more processing units of the PiNVSM device may jump six positions and manipulate data in data line 12A based on command #N+6 of code line 10A.

Figure 12:
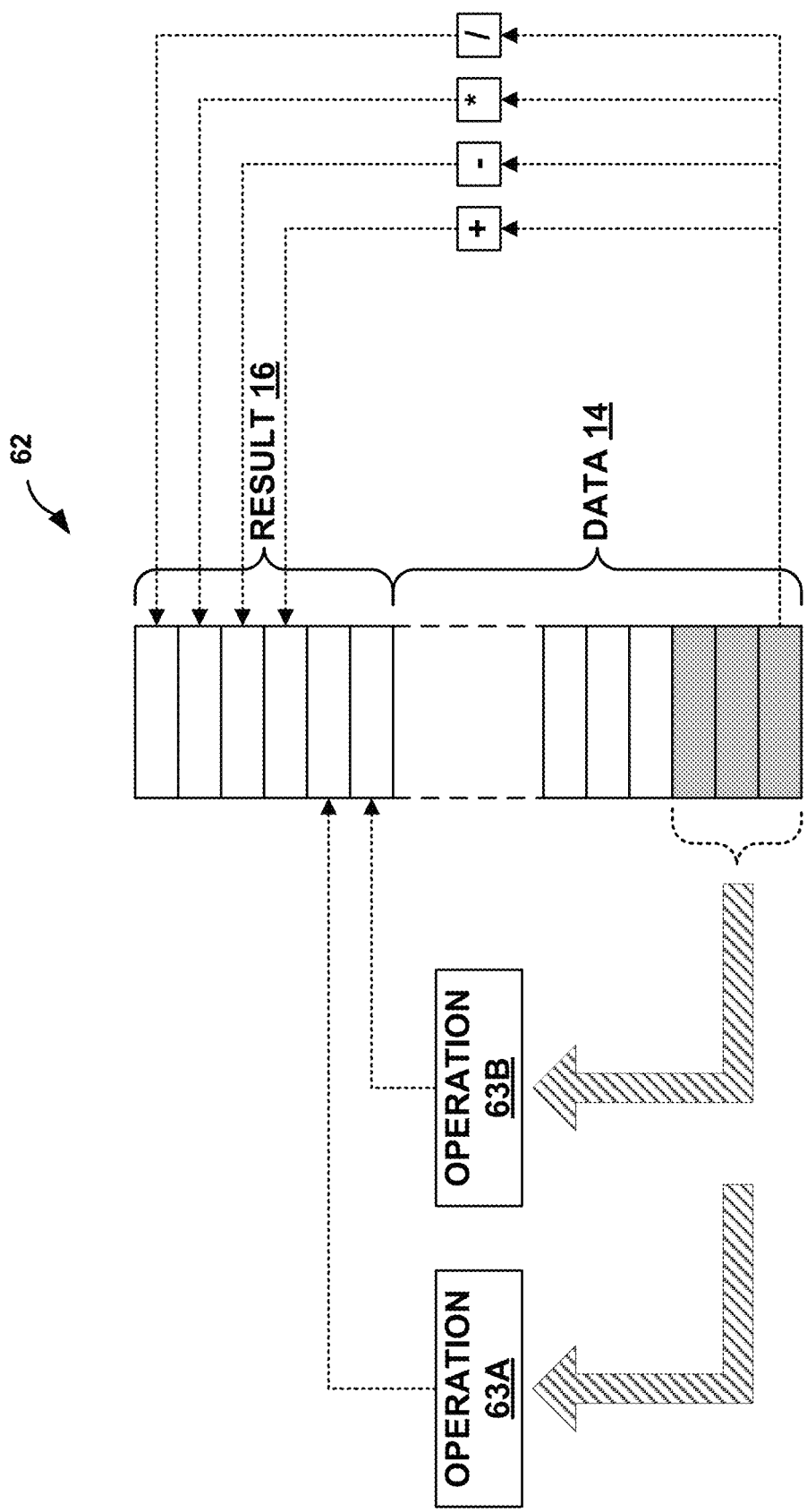
FIG. 12 is a conceptual diagram illustrating an optimized data line of a non-volatile storage device, in accordance with one or more techniques of this disclosure.

FIG. 12 is a conceptual diagram illustrating an optimized data line of a non-volatile storage device, in accordance with one or more techniques of this disclosure. As illustrated in FIG. 12, similar to data line 12A of FIG. 5, optimized data line 62 includes data portion 14 and results portion 16. As discussed above with reference to data line 12A, selectable locations included in data portion 14 store data, one or more operations (i.e., elementary operations of add, subtract, multiply, and divide) are connected to data portion 14 and the results of the operations are available at selectable locations included in results portion 16. However, as shown in FIG. 12, optimized data line 62 includes hardware operations 63A and 63B (collectively, "hardware operations 63").

Each of hardware operations 63 may be performed by one or more programmable processing units, such as one or more programmable processing units of DPUs 38 of FIG. 1. As discussed above, one or more programmable processing units of a PiNVSM device may be programmed to manipulate data using the most frequently used instruction sets. In the example of FIG. 12, operations 63 may correspond to the most frequently used instruction sets.

FIG. 13 is a conceptual diagram illustrating an example storage space of a non-volatile storage device, in accordance with one or more techniques of this disclosure. As shown in FIG. 13, similar to storage space 8 of FIG. 4, storage space 9 includes code lines 10, and data lines 12. As also shown in FIG. 13, storage space 9 include ID table 66.

ID table 66 may store an identification number of each instruction set (i.e., code line). For instance, ID table 66 may store a respective identification number of identification numbers 68A-68D (collectively, "IDs 68") for each of code lines 10A-10D. In some examples, each of IDs 68 may be an Inode ID, a globally unique identifier (GUID), or a hash value of the corresponding instruction set. For instance, ID 68A may be an Inode ID or a hash value of an instruction set included in code line 10A. In some examples, IDs 68 may be referred to as fingerprints of their corresponding instruction sets. In some examples, ID table 66 may be included in a hash table of a DPU, such as a DPU of DPUs 38 of FIG. 1.

Figure 14:
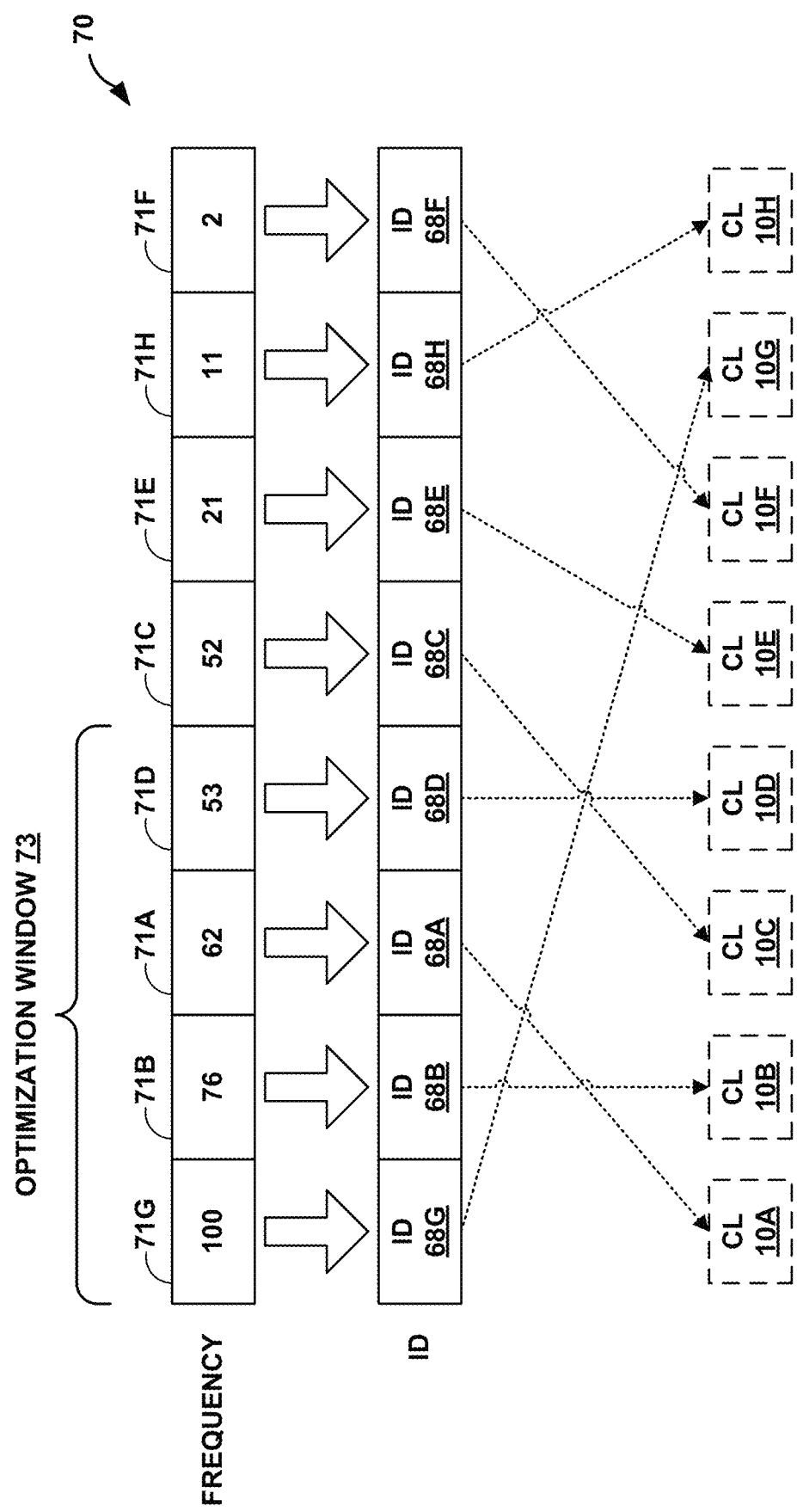
FIG. 14 is a conceptual diagram illustrating an example queue that may be maintained by a management unit, in accordance with one or more techniques of this disclosure.

FIG. 14 is a conceptual diagram illustrating an example queue that may be maintained by a management unit of a DPU, in accordance with one or more techniques of this disclosure. As discussed above, a PiNVSM device in DPUs 38 of FIG. 1, may maintain a queue (or queues) that includes, for respective instruction sets, a respective usage value that indicates a relative frequency at which the respective instruction set is used to manipulate data. As shown in FIG. 14, queue 70 includes, for respective instruction sets (i.e., code lines 10A-10H), a respective usage value (i.e., frequencies 71A-71H) that indicates a relative frequency at which the respective instruction set is used to manipulate data.

In some examples, queue 70 may be a competitive queue configured to sort IDs based on usage frequency (i.e., execution frequency). If the usage frequency of an instruction set grows, then an ID corresponding to the instruction set will migrate from a tail of queue 70 toward a head of queue 70. Similarly, an ID of an instruction set that is rarely executed may migrate toward the tail of queue 70 until the ID is pushed out of queue 70.

In some examples, queue 70 may initially be empty (i.e., may contain no IDs) and may be populated as statistics of usage are constructed (i.e., as instruction sets are executed). In some examples, queue 70 may be pre-configured with IDs predicted to be used more frequently. In either case, queue 70 may be updated overtime based on the actual usage frequencies of the instruction sets.

As discussed above, a Management Unit of a DPU, may select a group of instruction sets from the queue with the highest respective usage values as the most frequently used instruction sets for programming the one or more programmable processing units of DPUs 38. In some examples, the selected group of instruction sets may include instruction sets corresponding to IDs in optimization window 73.

Figure 15:
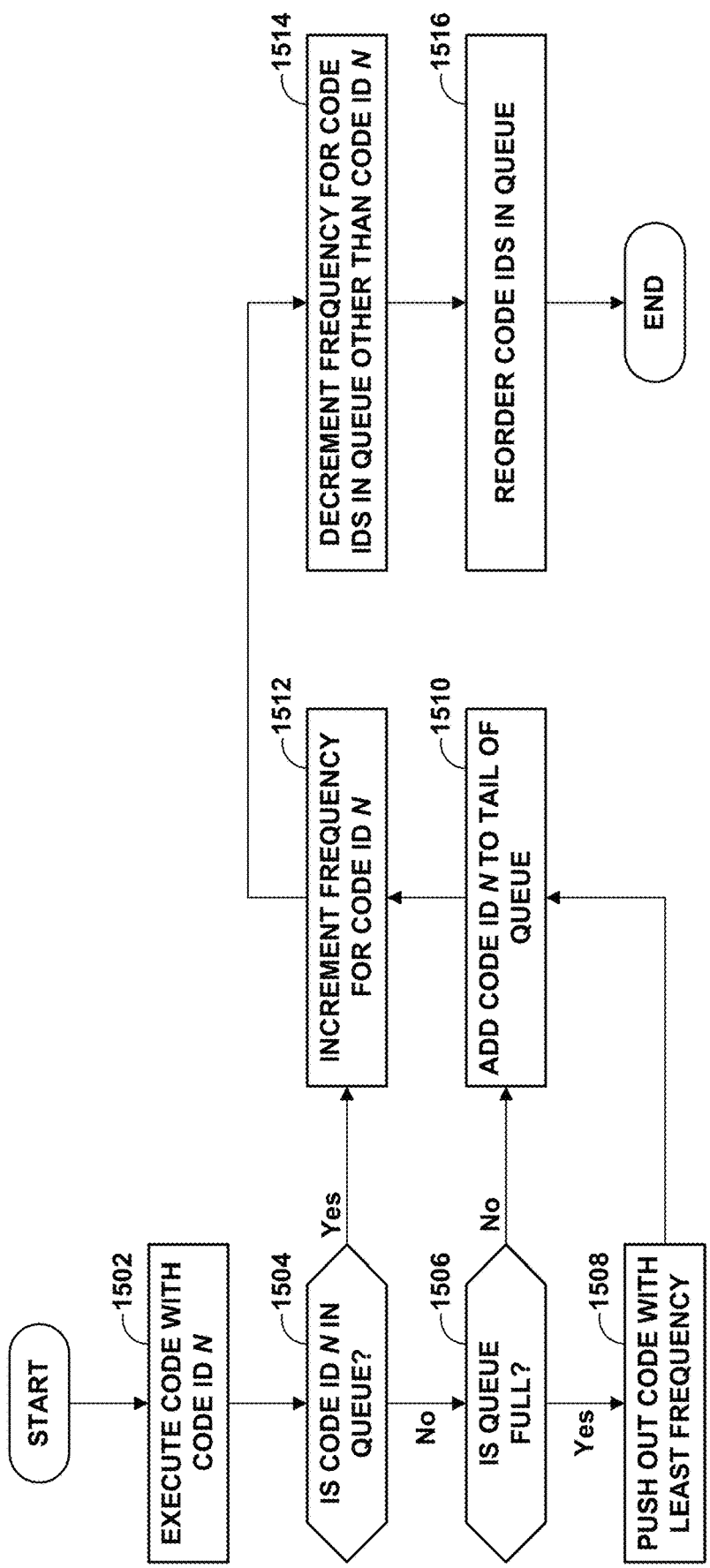
FIG. 15 is a flow diagram illustrating an example technique for maintaining a queue of instruction set usage frequency in a non-volatile storage device, in accordance with one or more techniques of this disclosure.

FIG. 15 is a flow diagram illustrating an example technique for maintaining a queue of instruction set usage frequency in a management unit, in accordance with one or more techniques of this disclosure. Other alternative embodiments of DPUs are possible to implement the same technique illustrated here.

In accordance with one or more techniques of this disclosure, DPU 38A may execute an instruction set having corresponding ID N (1502). For instance, one or more processing units of DPU 38A may manipulate, based on an instruction set obtained from code line 10C having corresponding ID 68C, data in data selectable locations of NVMAs 52 corresponding to data portions of data lines 12A-12C to generate results.

DPU 38A may determine whether ID N is included in a queue (1504). For instance, DPU 38A may determine whether queue 70 of FIG. 14 includes ID 68C. If ID N is not included in the queue ("No" branch of 1704), DPU 38A may determine whether the queue is full (1506). For instance, DPU 38A may determine whether a quantity of identifiers included in the queue is greater than a threshold quantity of usage values (e.g., 4, 8, 16, 32, 50, 64, 128, etc.). The queue may be a specific size, and DPU 38A may need to maintain the queue based on its size limitation and other factors.

If the queue is full ("Yes" branch of 1506), DPU 38A may push an ID with the lowest frequency out of the queue (1508). For instance, responsive to determining that a quantity of identifiers included in queue 70 is greater than a threshold quantity of usage values, DPU 38A may remove an identifier having a lowest usage value from queue 70.

If the queue is not full ("No" branch of 1506) or after pushing the ID with the lowest frequency out of the queue, DPU 38A may add ID N to the tail of the queue (1510). For instance, responsive to determining that queue 70 does not include an identifier corresponding to a particular instruction set, DPU 38A may add the identifier corresponding to the particular instruction set to the tail of the queue.

If ID N not included in the queue ("Yes" branch of 1504) or after adding ID N to the queue, DPU 38A may increment a frequency for ID N (1512). For instance, the management unit may increment a value of frequency 71C of FIG. 14 from 52 to 53.

DPU 38A may decrement a frequency for IDs included in the queue other than ID N (1514). For instance, DPU 38A may decrement a value of frequency 71G of FIG. 14 from 100 to 99, a value of frequency 71B of FIG. 14 from 76 to 75, value of frequency 71A of FIG. 14 from 62 to 61, value of frequency 71D of FIG. 14 from 53 to 52, value of frequency 71E of FIG. 14 from 21 to 20, value of frequency 71H of FIG. 14 from 11 to 10, and value of frequency 71F of FIG. 14 from 2 to 1.

DPU 38A may reorder the IDs included in the queue (1516). For instance, as the incremented value of frequency 71C (i.e., 53) is now greater than the decremented value of frequency 71D (i.e., 52), storage device 6A may swap positions of ID 68C and ID 68D.

After reordering the IDs in the queue, DPU 38A may determine if there has been a change in the IDs included in an optimization window. For instance, after swapping positions of ID 68C and ID 68D, DPU 38A may determine that ID 68C is now included in optimization window 73 and ID 68D is no longer included in optimization window 73. In response to determining that there has been a change in the IDs included in an optimization window, DPU 38A may program one or more programmable processing units to manipulate data using instruction sets corresponding to the IDs currently included in the optimization window. For instance, DPU 38A may program one or more programmable processing units of DPU 38A that were programmed to manipulate data using an instruction set obtained from code line 10D to manipulate data using an instruction set obtained from code line 10C.

Figure 16:
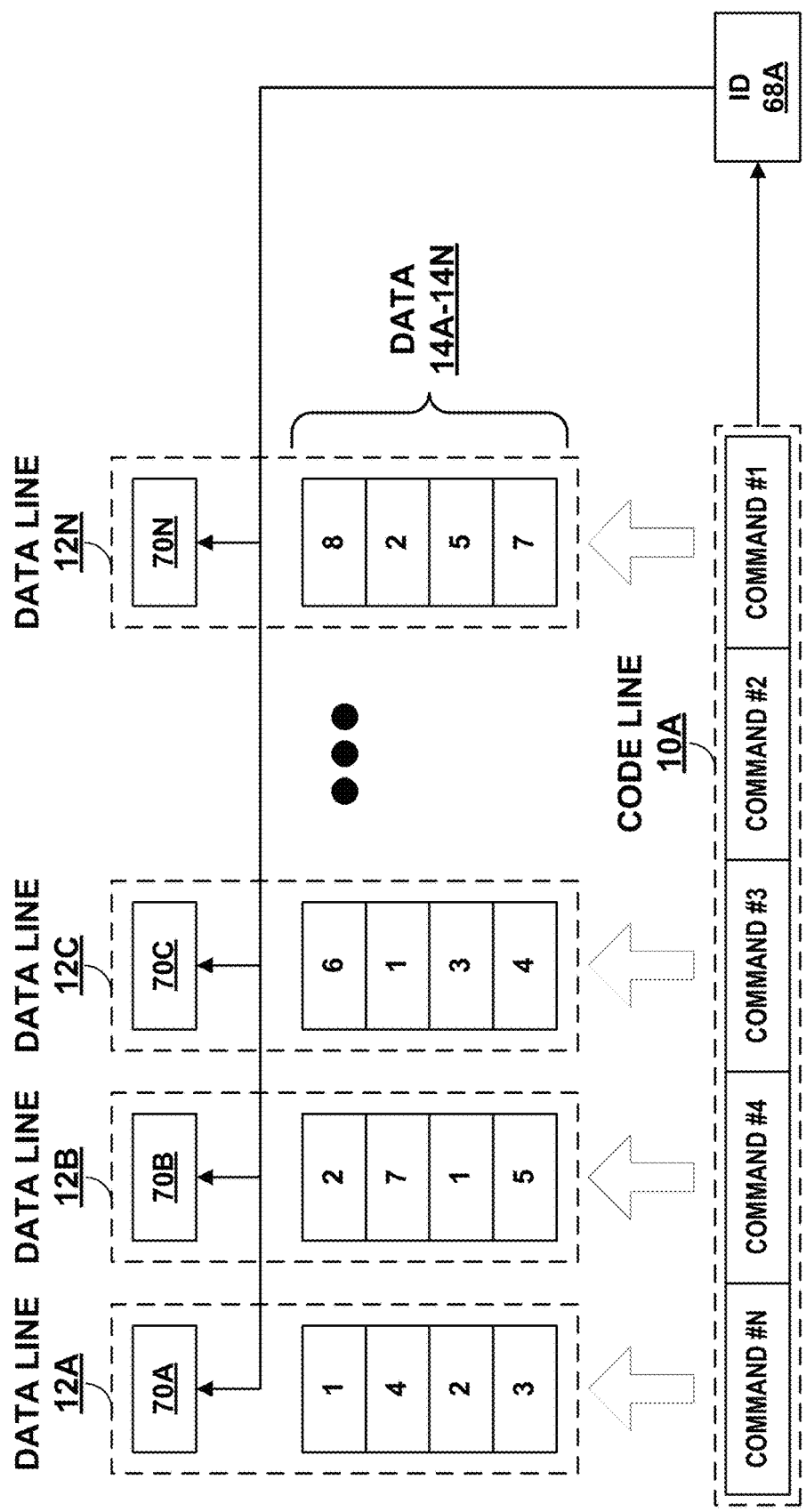
FIG. 16 is a conceptual diagram illustrating queue maintenance in a DPU, in accordance with one or more techniques of this disclosure.

FIG. 16 is a conceptual diagram illustrating queue maintenance in a DPU, in accordance with one or more techniques of this disclosure. As discussed above, a DPU may maintain a queue that indicates usage frequencies of instruction sets. In some examples, different data lines may be processed by different software primitives and with different frequencies. As such, in some examples, a DPU may maintain multiple queues. For instance, a DPU may maintain, for each respective data line of a plurality of data lines, a respective queue that includes, for respective instruction sets, a respective usage value that indicates a relative frequency at which the respective instruction set is used to manipulate data in the respective data line.

As shown in FIG. 16, a DPU of DPUs 38, may maintain a respective queue of queues 70A-70N for each of data lines 12A-12N. The DPU may maintain each of queues 70 in a manner similar to queue 70 of FIG. 14. For instance, the DPU may maintain each of queues 70 using the techniques of FIG. 15. In particular, in the example of FIG. 16, responsive to determining that one or more processing units manipulated (or are manipulating) data in data lines 12A-12N based on an instruction set obtained from code line 10A having ID 68A, the DPU may perform the technique of FIG. 15 with ID N as ID 68A to update each of queues 70A-70N.

Figure 17:
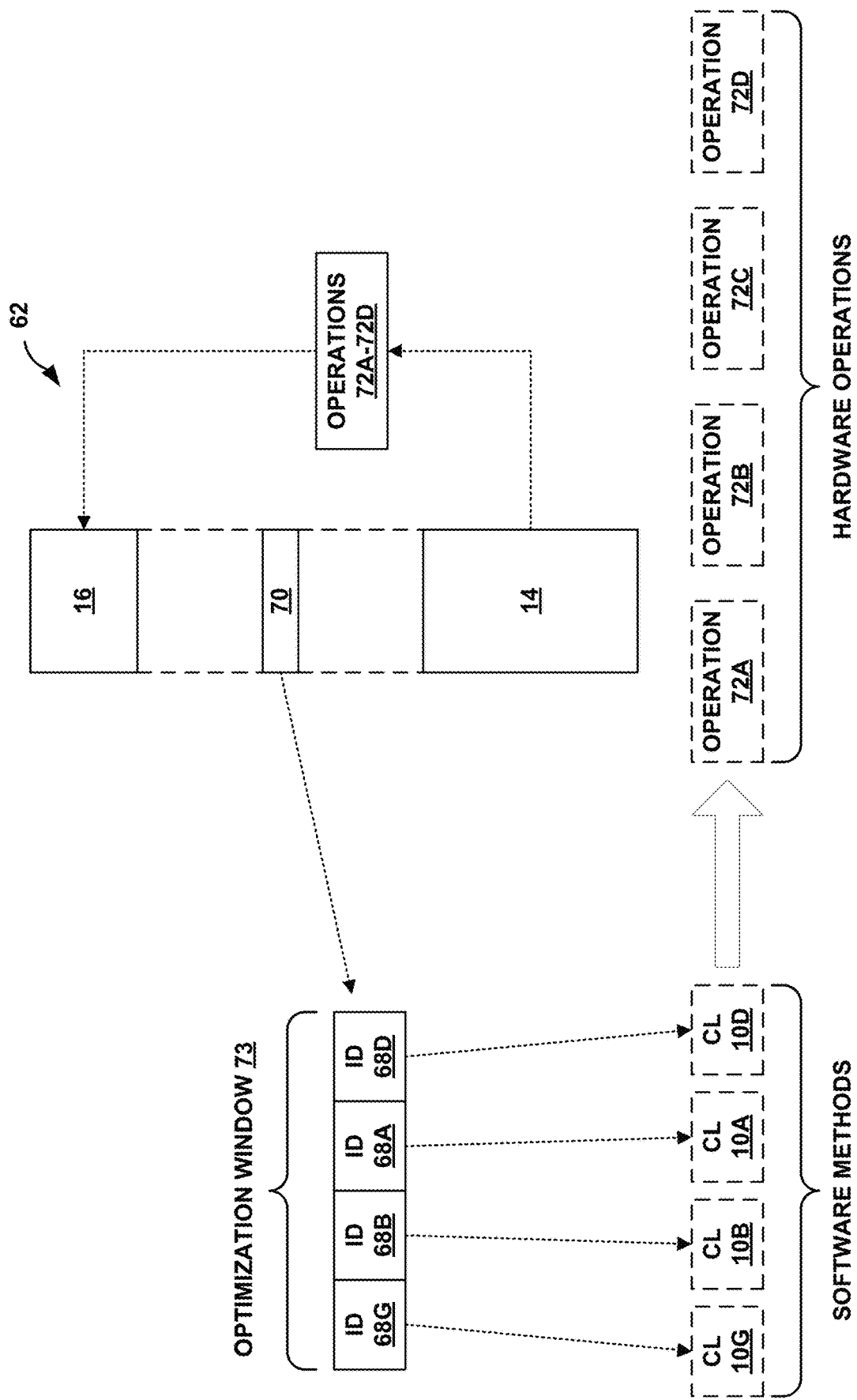
FIG. 17 is a conceptual diagram illustrating optimization of a data line of a non-volatile storage device, in accordance with one or more techniques of this disclosure.

FIG. 17 is a conceptual diagram illustrating optimization of a data line of a non-volatile storage device, in accordance with one or more techniques of this disclosure. As shown in FIG. 17, optimized data line 62 includes data portion 14, results portion 16, and queue 70. As discussed above, one or more programmable processing units, such as one or more programmable processing units of DPUs 38, may be programmed to manipulate data using instruction sets included in an optimization window of a queue. As shown in FIG. 17, based on optimization window 73 of queue 70 including IDs 68G, 68B, 68A, and 68D, which correspond to code lines 10G, 10B, 10A, and 10D, one or more programmable processing units may be programmed to perform hardware operations 72A-72D, which correspond to instruction sets obtained from code lines 10G, 10B, 10A, and 10D. As shown in FIG. 17, hardware operations 72A-72D may manipulate data stored in selectable locations of non-volatile memory corresponding to data portion 14 and store results of the manipulation in selectable locations of non-volatile memory corresponding to results portion 14.

Figure 18:
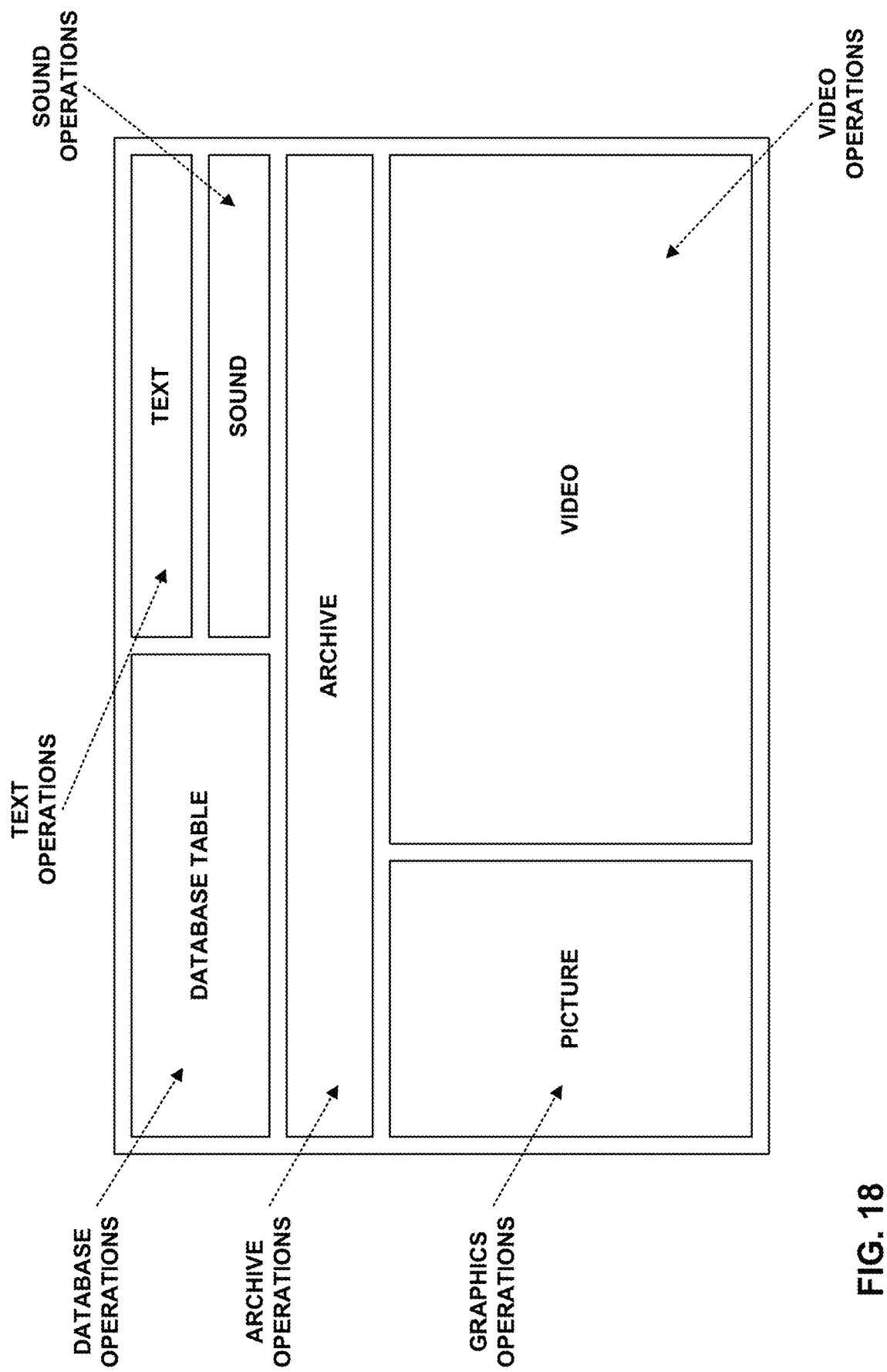
FIG. 18 is a conceptual diagram illustrating data types stored by a PiNVSM device, in accordance with one or more techniques of this disclosure.

FIG. 18 is a conceptual diagram illustrating data types stored by a PiNVSM device, in accordance with one or more techniques of this disclosure. Different portions of a PiNVSM device may store different types of data. As shown in FIG. 18, a first portion of a PiNVSM device may store a database table, a second portion of the PiNVSM device may store text data, a third portion of the PiNVSM device may store sound data, a fourth portion of the PiNVSM device may store archive data, a fifth portion of the PiNVSM device may store picture data, and a sixth portion of the PiNVSM device may store video data.

As discussed above, a PiNVSM device may self-optimize. For instance, the optimization of independent data lines may provide a basis for dynamic and data-oriented evolving of different part of the same PiNVSM device with different specializations. Changing of storage data landscape (layout) may result in dynamic self-reconfiguration of non-volatile storage device's internals (i.e., re-programming of one or more programmable processing units).

Figure 19:
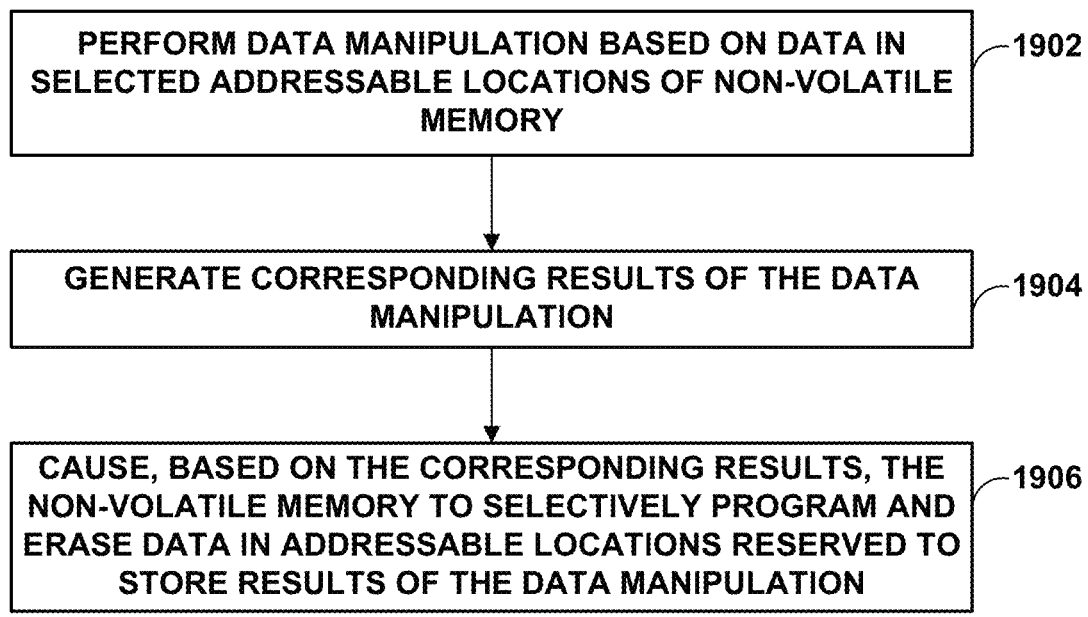
FIG. 19 is a flow diagram illustrating an example technique for manipulating data in a PiNVSM device, in accordance with one or more techniques of this disclosure.

FIG. 19 is a flow diagram illustrating an example technique for manipulating data in a PiNVSM device, in accordance with one or more techniques of this disclosure. The technique of FIG. 19 will be described with reference to DPU 38A of FIG. 1 for ease of description, although PiNVSM devices having configurations different than that of DPU 38A may perform the techniques of FIG. 19.

In accordance with one or more techniques of this disclosure, DPU 38A may perform data manipulation based on data in selected locations of non-volatile memory (1902) to generate corresponding results of the data manipulation (1904). For instance, as shown in the example of FIG. 9, one or more processing units of DPU 38A may manipulate, based on an instruction set obtained from code line 10A, data in selectable locations of an NVMA of DPU 38A corresponding to data portions 14A-14N of data lines 12A-12N to generate results (a total in this example).

DPU 38A may cause, based on the corresponding results, the non-volatile memory to selectively program and erase data in selectable locations reserved to store results of the data manipulation (1906). For instance, one or more processing units of DPU 38A may cause the NVMA of DPU 38A to selectively program and erase data in selectable locations corresponding to results portions 16A-16N of data lines 12A-12N to store the generated results of the data manipulation.

Figure 20:
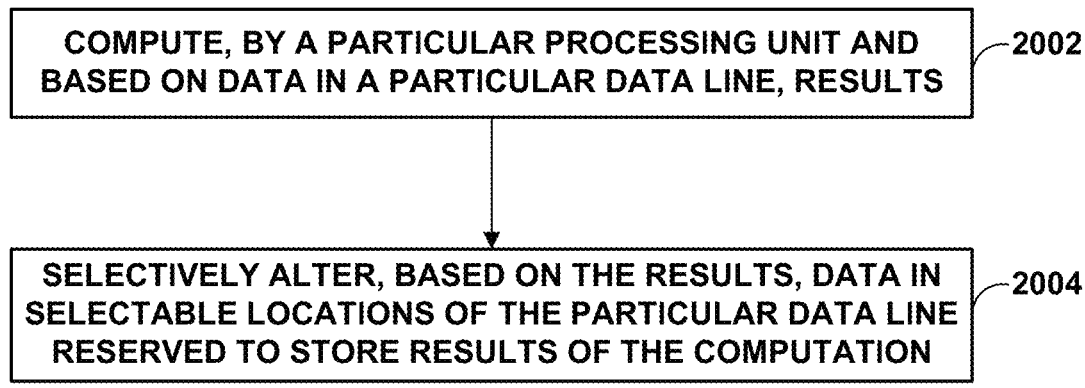
FIG. 20 is a flow diagram illustrating an example technique for manipulating data in a PiNVSM device, in accordance with one or more techniques of this disclosure.

FIG. 20 is a flow diagram illustrating an example technique for manipulating data in a PiNVSM device, in accordance with one or more techniques of this disclosure. The technique of FIG. 20 will be described with reference to DPU 38A of FIG. 1 for ease of description, although PiNVSM devices having configurations different than that of DPU 38A may perform the techniques of FIG. 20.

In accordance with one or more techniques of this disclosure, ALU 50A of DPU 38A may compute, based on data in a particular data line, results (2002). For instance, as shown in the example of FIG. 5, ALU 50A may compute results of one or more elementary operation on data in data portion 14 of data line 12A (which may include one or more selectable locations of NVMA 52A).

ALU 50A may selectively alter, based on the computed results, data in selectable locations of the particular data line reserved to store results of the data manipulation (2004). For instance, as shown in the example of FIG. 5, ALU 50A may selectively alter, based on the computed results, data in results portion 16 of data line 12A.

The following numbered examples may illustrate one or more aspects of the disclosure:

Example 1

A computing system comprising a device, the device comprising: a non-volatile memory divided into a plurality of selectable locations, each bit in the non-volatile memory configured to have corresponding data independently altered, wherein the selectable locations are grouped into a plurality of data lines; and one or more processing units coupled to the non-volatile memory, each of the processing units associated with a data line of the plurality of data lines, and each of the processing units configured to compute, based on data in an associated data line of the plurality of data lines, corresponding results, wherein the non-volatile memory is configured to selectively write, based on the corresponding results, data in selectable locations of the associated data line reserved to store results of the computation from the process unit associated with the associated data line.

Example 2

The computing system of example 1, wherein the one or more processing units are configured to compute the corresponding results based on execution code, further comprising a management unit configured to: obtain the execution code from the non-volatile memory that comprise code lines.

Example 3

The computing system of example 2, wherein the execution code in each of the code lines contains a sequence of instructions.

Example 4

The computing system of example 3, wherein each of the one or more processing units is configured to concurrently compute results for an associated data line of the plurality of data lines based on respective instructions of a sequence of instructions represented by a code line of the code lines.

Example 5

The computing system of any combination of examples 1-4, wherein the instructions in the sequence of instructions comprise elementary operations.

Example 6

The computing system of any combination of examples 1-5, wherein the device comprises an integrated circuit (IC).

Example 7

The computing system of any combination of examples 1-6, wherein the device is a first data processing unit (DPU) of a plurality of DPUs that each include a respective non-volatile memory and a respective one or more processing units, the computing system further comprising: one or more routers configured to transfer data and instructions amongst the plurality of DPUs.

Example 8

The computing system of any combination of examples 1-7, wherein altering corresponding data of a bit in the non-volatile memory comprises programming or erasing the corresponding data, wherein programming data of a particular bit in the non-volatile memory does not alter data of other bits of the non-volatile memory, and wherein erasing data of the particular bit in the non-volatile memory does not alter data of other bits of the non-volatile memory.

Example 9

A method comprising: computing, by a particular processing unit of one or more processing units coupled to a non-volatile memory that is divided into a plurality of selectable locations that are grouped into a plurality of data lines and based on data in a particular data line of the plurality of data lines that is associated with the processing unit, corresponding results, wherein each selectable location in the non-volatile memory configured to be independently programmed and erased, wherein each processing unit of the processing units is associated with a data line of the plurality of data lines, and wherein the one or more processing units and the non-volatile memory are included on the same chip; and selectively altering, based on the corresponding results, data in selectable locations of the particular data line reserved to store results of the computation from the process unit associated with the particular data line.

Example 10

The method system of example 9, wherein the corresponding results are computed based on execution code, and wherein the method further comprises: obtaining the execution code from the non-volatile memory that comprise code lines.

Example 11

The method of example 10, wherein the execution code in each of the code lines contains a sequence of instructions.

Example 12

The method of example 11, further comprising: concurrently computing, by respective processing units of the one or more processing units and based on respective instructions of a sequence of instructions represented by a code line of the code lines, results for respective data lines associated with the respective processing units.

Example 13

The method of any combination of examples 9-12, wherein the instructions in the sequence of instructions comprise elementary operations.

Example 14

The method of any combination of examples 9-13, wherein the chip is a first data processing unit (DPU) of a plurality of DPUs that each include a respective non-volatile memory and a respective one or more processing units, the method further comprising: transferring, by one or more routers, data or instructions amongst the plurality of DPUs.

Example 15

The method of any combination of examples 9-14, further comprising: associating, at a first time, a first group of selectable locations of the plurality of selectable locations with a particular data line of the plurality of data lines associated with a particular processing unit of the plurality of processing units; and associating, at a second time, a second group of selectable locations of the plurality of selectable locations with the particular data line, wherein the first group of selectable locations is different than the second group of selectable locations.

Example 16

A processor in memory device comprising: a plurality of means for computing, based on data in data lines that each include one or more selectable locations of a non-volatile memory that is divided into a plurality of selectable locations, corresponding results, wherein each selectable location in the non-volatile memory configured to be independently programmed and erased, wherein each of the plurality of means for computing is associated with a data line of the plurality of data lines, and wherein the plurality of means for computing and the non-volatile memory are included on the same chip; and means for selectively altering, based on the corresponding results, data in selected locations of the data lines reserved to store results of the computation from the means for computing associated with the data line.

Example 17

The processor in memory device of example 16, wherein the plurality of means for computing are configured to compute the corresponding results based on execution code, further comprising: means for obtaining the execution code from the non-volatile memory that comprise code lines.

Example 18

The processor in memory device of any combination of examples 16-17, wherein the execution code in each of the code lines contains a sequence of instructions, wherein each of the plurality of means for computing is configured to concurrently compute results for an associated data line of the plurality of data lines based on respective instructions of a sequence of instructions represented by a code line of the code lines Example 19

The processor in memory device of any combination of examples 16-18, wherein the instructions in the sequence of instructions comprise elementary operations.

Example 20

The processor in memory device of any combination of examples 16-19, the processor in memory device is an integrated circuit (IC).

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A computing system, comprising:
a non-volatile memory configured to store data in at least one data line; and
one or more processing units configured to compute, based on the stored data, corresponding results, and write the corresponding results to an associated at least one data line in the non-volatile memory;
wherein at least one of the one or more processing units are programmed to compute the corresponding results using a sequence of instructions selected from at least one code line in the non-volatile memory based on a frequency of use of the sequence of instructions in manipulating the data from the at least one data line,
wherein altering corresponding data of a bit in the non-volatile memory comprises programming or erasing the corresponding data,
wherein programming data of a particular bit in the non-volatile memory does not alter data of other bits of the non-volatile memory, and
wherein erasing data of the particular bit in the non-volatile memory does not alter data of other bits of the non-volatile memory.

2. The system of claim 1, further comprising a management unit configured to:
obtain the sequence of instructions from the non-volatile memory in the at least one code line.

3. The system of claim 2, wherein each of the one or more processing units is configured to concurrently compute results for the data in the at least one data line based on respective instructions of the sequence of instructions represented by the at least one code line.

4. The system of claim 1, wherein the computing system comprises an integrated circuit (IC).

5. The system of claim 1, wherein the computing system comprises a first data processing unit (DPU) of a plurality of DPUs that each include a respective non-volatile memory and a respective one or more processing units, the system further comprising: one or more routers configured to transfer data and instructions amongst the plurality of DPUs.

6. A computing system, comprising:
a non-volatile memory configured to store data in at least one data line; and
one or more processing units configured to compute, based on the stored data, corresponding results, and write the corresponding results to an associated at least one data line in the non-volatile memory;
wherein at least one of the one or more processing units are programmed to compute the corresponding results using a sequence of instructions selected from at least one code line in the non-volatile memory based on a frequency of use of the sequence of instructions in manipulating the data from the at least one data line, and
wherein the non-volatile memory is divided into a plurality of selectable locations and the data is stored in one of the selectable locations, and each of the processing units is configured to write to another one of the selectable locations without first erasing a block of the selectable locations including the one of the selectable locations storing the data.

7. The system of claim 6, wherein a granularity of each of the selectable locations is smaller than a page.

8. A computing system, comprising:
a non-volatile memory configured to store data in at least one data line; and
one or more means for computing configured to compute, based on the stored data, corresponding results, and write the corresponding results to an associated at least one data line in the non-volatile memory;
wherein at least one of the means for computing are programmed to compute the corresponding results using a sequence of instructions selected from at least one code line in the non-volatile memory based on a frequency of use of the sequence of instructions in manipulating the data from the at least one data line, and
wherein the non-volatile memory is divided into a plurality of selectable locations and the data is stored in one of the selectable locations, and each of the means for computing is configured to write to another one of the selectable locations without first erasing a block of the selectable locations including the one of the selectable locations storing the data.

9. The system of claim 8, wherein a granularity of each of the selectable locations is smaller than a page.

10. A method of computing, the method comprising:
storing data in a non-volatile memory using at least one data line; and
computing, by one or more processing units based on the stored data, corresponding results, and writing the corresponding results to an associated at least one data line in the non-volatile memory;
wherein the corresponding results are computed using a sequence of instructions selected from the non-volatile memory based on a frequency of use of the sequence of instructions in manipulating the data from the at least one data line, and
wherein the non-volatile memory is divided into a plurality of selectable locations, the method further comprising:
associating, at a first time, a first group of selectable locations of the plurality of selectable locations with a particular data line of a plurality of data lines; and
associating, at a second time, a second group of selectable locations of the plurality of selectable locations with the particular data line, wherein the first group of selectable locations is different than the second group of selectable locations.

11. The method of claim 10, further comprising:
obtaining the sequence of instructions from the non-volatile memory in at least one code line.

12. The method of claim 11, further comprising:
concurrently computing, by respective processing units of the one or more processing units and based on respective instructions of the sequence of instructions represented by the at least one code line, results for data in respective data lines associated with the respective processing units.

13. The method of claim 12, wherein the instructions in the sequence of instructions comprise elementary operations.

14. The method of claim 10, wherein the storing in the non-volatile memory and the computing and writing by the one or more of the processing units are performed on a chip, wherein the chip is a first data processing unit (DPU) of a plurality of DPUs that each include a respective non-volatile memory and a respective one or more processing units, the method further comprising:
transferring, by one or more routers, data or instructions amongst the plurality of DPUs.

15. A method of computing, the method comprising:
storing data in a non-volatile memory using at least one data line; and computing, by one or more processing units based on the stored data, corresponding results, and writing the corresponding results to an associated at least one data line in the non-volatile memory, wherein the corresponding results are computed using a sequence of instructions selected from the non-volatile memory based on a frequency of use of the sequence of instructions in manipulating the data from the at least one data line, and wherein the non-volatile memory is divided into a plurality of selectable locations and the data is stored in one of the selectable locations, and the writing comprises:

writing, by one of the processing units, to another one of the selectable locations without first erasing a block of the selectable locations including the one of the selectable locations storing the data.

16. The method of claim 15, wherein a granularity of each of the selectable locations is smaller than a page.

* * * * *